(12) United States Patent
Yeh et al.

(10) Patent No.: US 12,406,898 B2
(45) Date of Patent: Sep. 2, 2025

(54) CHIP PACKAGE STRUCTURE WITH LID

(71) Applicant: Taiwan Semiconductor Manufacturing Company, Ltd., Hsinchu (TW)

(72) Inventors: Shu-Shen Yeh, Taoyuan (TW); Che-Chia Yang, Taipei (TW); Yu-Sheng Lin, Zhubei (TW); Chin-Hua Wang, New Taipei (TW); Po-Yao Lin, Zhudong Township, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/751,724

(22) Filed: Jun. 24, 2024

(65) Prior Publication Data
US 2024/0347410 A1    Oct. 17, 2024

Related U.S. Application Data

(62) Division of application No. 17/459,347, filed on Aug. 27, 2021, now Pat. No. 12,033,913.

(51) Int. Cl.
H01L 23/367    (2006.01)
H01L 21/48    (2006.01)
(Continued)

(52) U.S. Cl.
CPC ........ *H01L 23/367* (2013.01); *H01L 21/4882* (2013.01); *H01L 25/0655* (2013.01);
(Continued)

(58) Field of Classification Search
CPC ............ H01L 23/3675; H01L 21/4882; H01L 25/0655; H01L 25/18; H01L 25/50;
(Continued)

(56) References Cited

U.S. PATENT DOCUMENTS 10,770,369 B2    9/2020    Hung
2001/0023533 A1    9/2001    Sylvester
(Continued)

FOREIGN PATENT DOCUMENTS

CN    101131974 A    2/2008
TW    200826109 A    6/2008
TW    202010072 A    3/2020

OTHER PUBLICATIONS

Chinese language office action dated Aug. 2, 2022, issued in application No. TW 111103896.

*Primary Examiner* — Patricia D Valenzuela
(74) *Attorney, Agent, or Firm* — McClure, Qualey & Rodack, LLP

(57) ABSTRACT

A chip package structure is provided. The chip package structure includes a wiring substrate. The chip package structure includes a first chip structure over the wiring substrate. The chip package structure includes a heat-spreading lid over the wiring substrate and covering the first chip structure. The heat-spreading lid includes a ring structure and a top plate, the ring structure surrounds the first chip structure, the top plate covers the ring structure and the first chip structure, and the first chip structure has a first sidewall and a second sidewall opposite to the first sidewall.

20 Claims, 25 Drawing Sheets

(51) Int. Cl.
  *H01L 25/00* (2006.01)
  *H01L 25/065* (2023.01)
  *H01L 25/18* (2023.01)
  *H01L 21/56* (2006.01)
  *H01L 23/00* (2006.01)
  *H01L 23/04* (2006.01)

(52) U.S. Cl.
  CPC .............. *H01L 25/18* (2013.01); *H01L 25/50* (2013.01); *H01L 21/56* (2013.01); *H01L 23/04* (2013.01); *H01L 24/32* (2013.01); *H01L 24/33* (2013.01); *H01L 24/73* (2013.01); *H01L 2224/32245* (2013.01); *H01L 2224/33181* (2013.01); *H01L 2224/73204* (2013.01); *H01L 2224/73253* (2013.01)

(58) Field of Classification Search
  CPC ......... H01L 21/56; H01L 23/04; H01L 24/32; H01L 24/33; H01L 24/73; H01L 2224/32245; H01L 2224/33181; H01L 2224/73204; H01L 2224/73253; H01L 23/145; H01L 23/15; H01L 23/5383; H01L 24/11; H01L 24/13; H01L 24/16; H01L 24/29; H01L 24/83; H01L 24/92; H01L 2224/11462; H01L 2224/13082; H01L 2224/13111; H01L 2224/13124; H01L 2224/13147; H01L 2224/13155; H01L 2224/13157; H01L 2224/13184; H01L 2224/16227; H01L 2224/2919; H01L 2224/29191; H01L 2224/2929; H01L 2224/29339; H01L 2224/32225; H01L 2224/81424; H01L 2224/81447; H01L 2224/81484; H01L 2224/83191; H01L 2224/83447; H01L 2224/8346; H01L 2224/83486; H01L 2224/8349; H01L 2224/92125; H01L 2224/92225; H01L 2924/19041; H01L 2924/19042; H01L 2924/19043; H01L 2924/19105; H01L 23/10; H01L 23/42; H01L 23/36; H01L 21/50; H01L 21/52; H01L 23/3157
  See application file for complete search history.

(56) References Cited

U.S. PATENT DOCUMENTS

| | | | |
|---|---|---|---|
| 2008/0135999 A1 | 6/2008 | Yang | |
| 2010/0059880 A1 | 3/2010 | Baek | |
| 2015/0001701 A1* | 1/2015 | Li | H05K 5/03 257/713 |
| 2015/0162307 A1* | 6/2015 | Chen | H01L 21/56 438/107 |
| 2020/0066612 A1* | 2/2020 | Hung | H01L 23/055 |

* cited by examiner

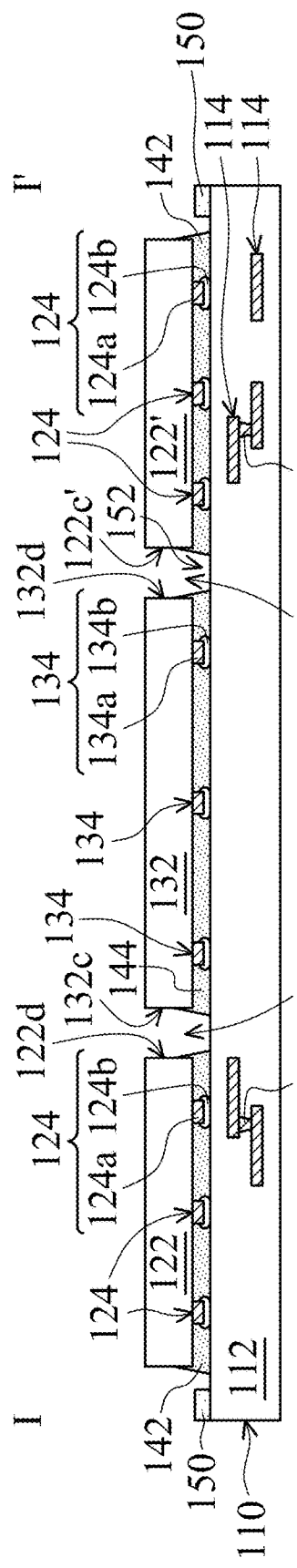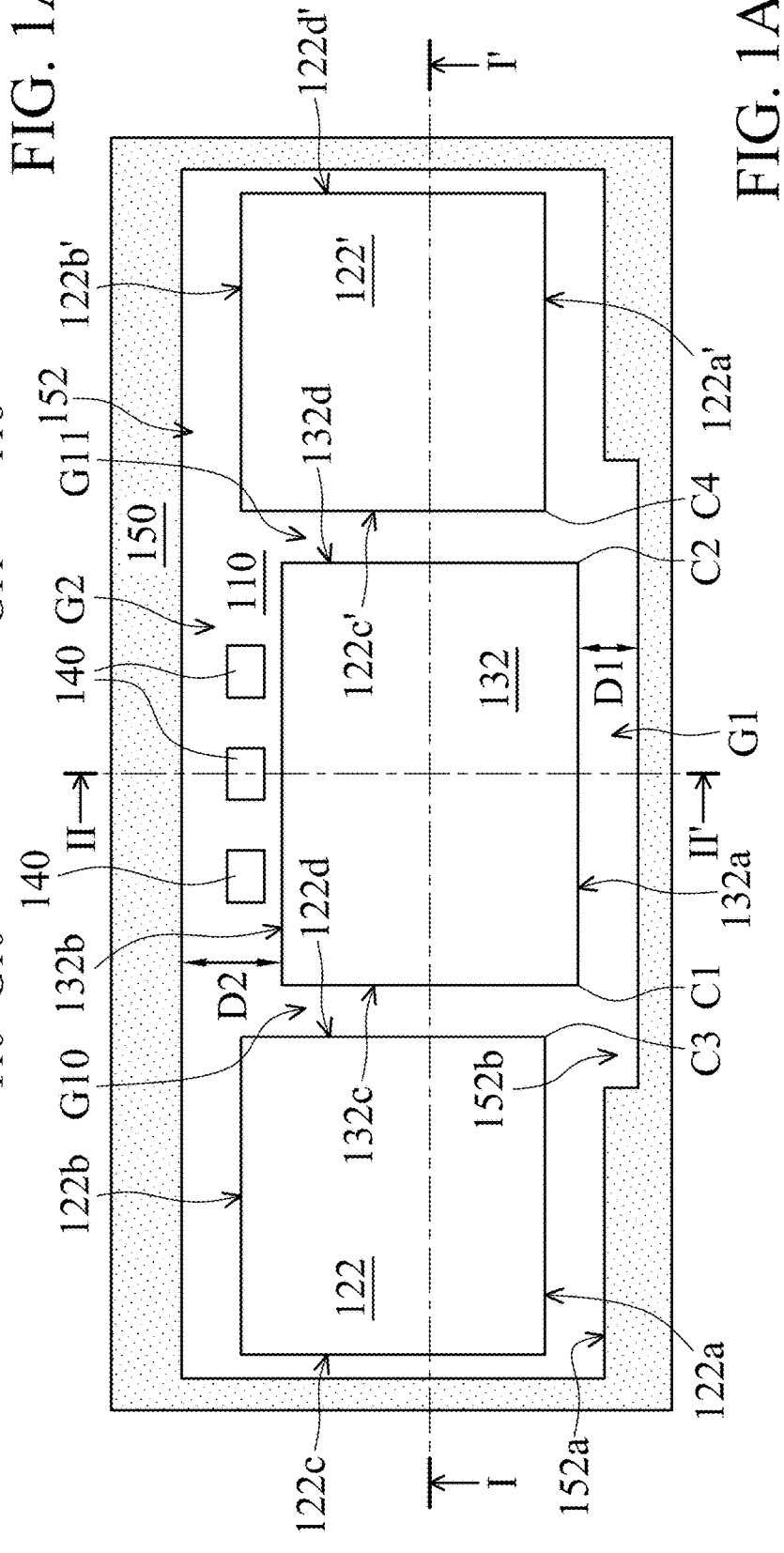
FIG. 1A
FIG. 1A-1

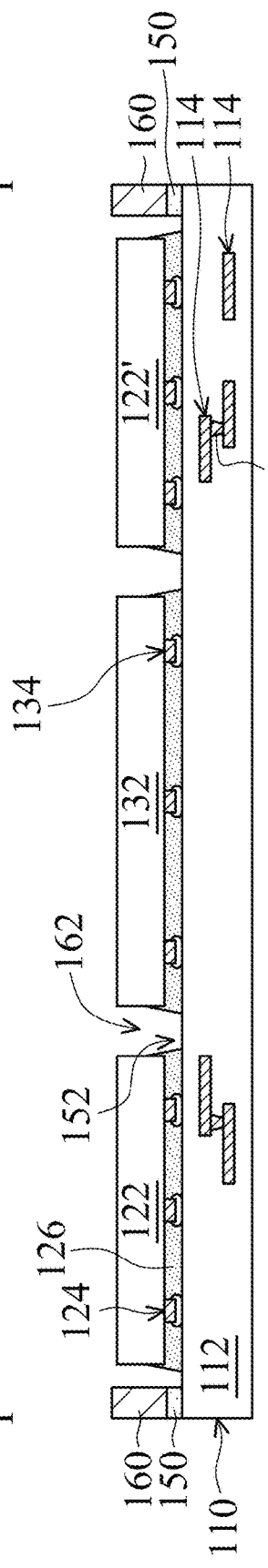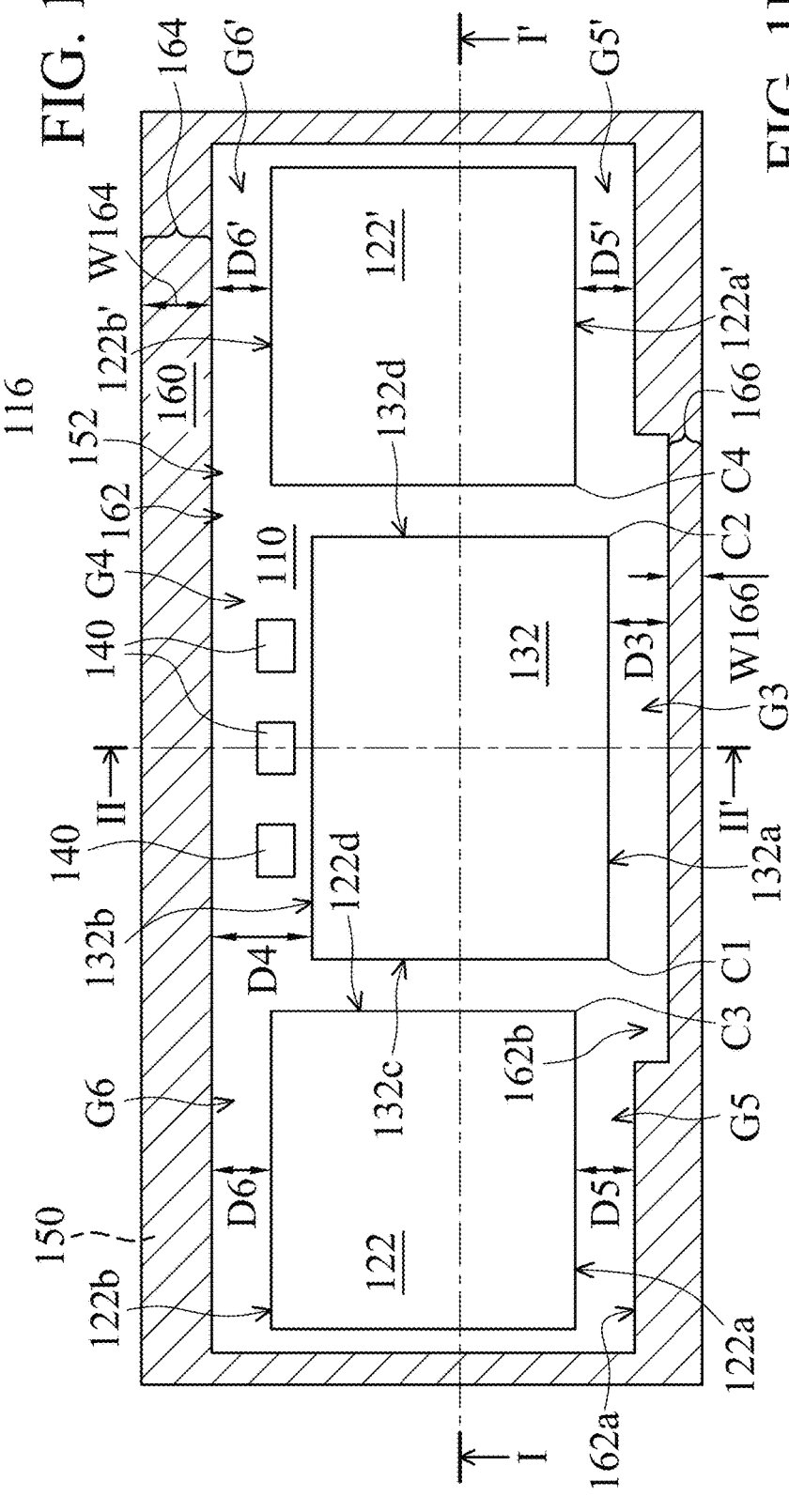
FIG. 1B
FIG. 1B-1

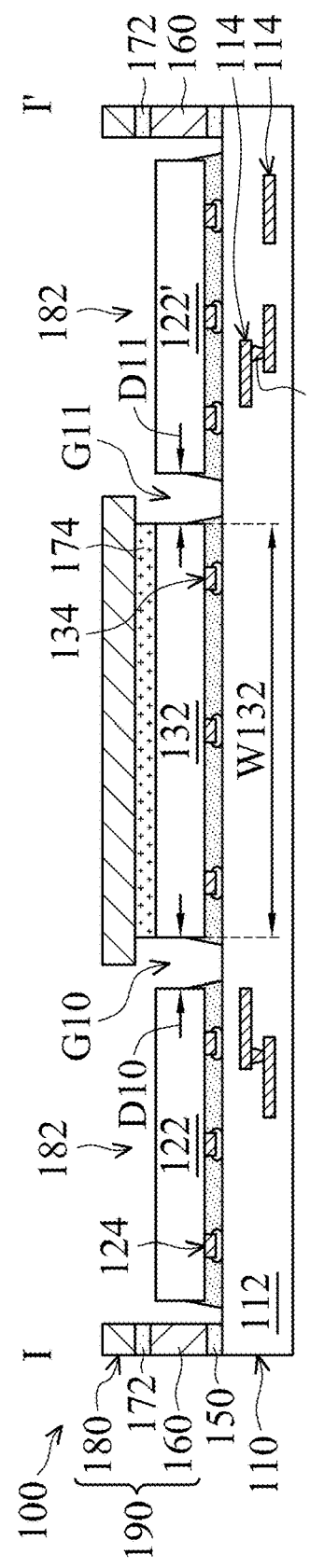
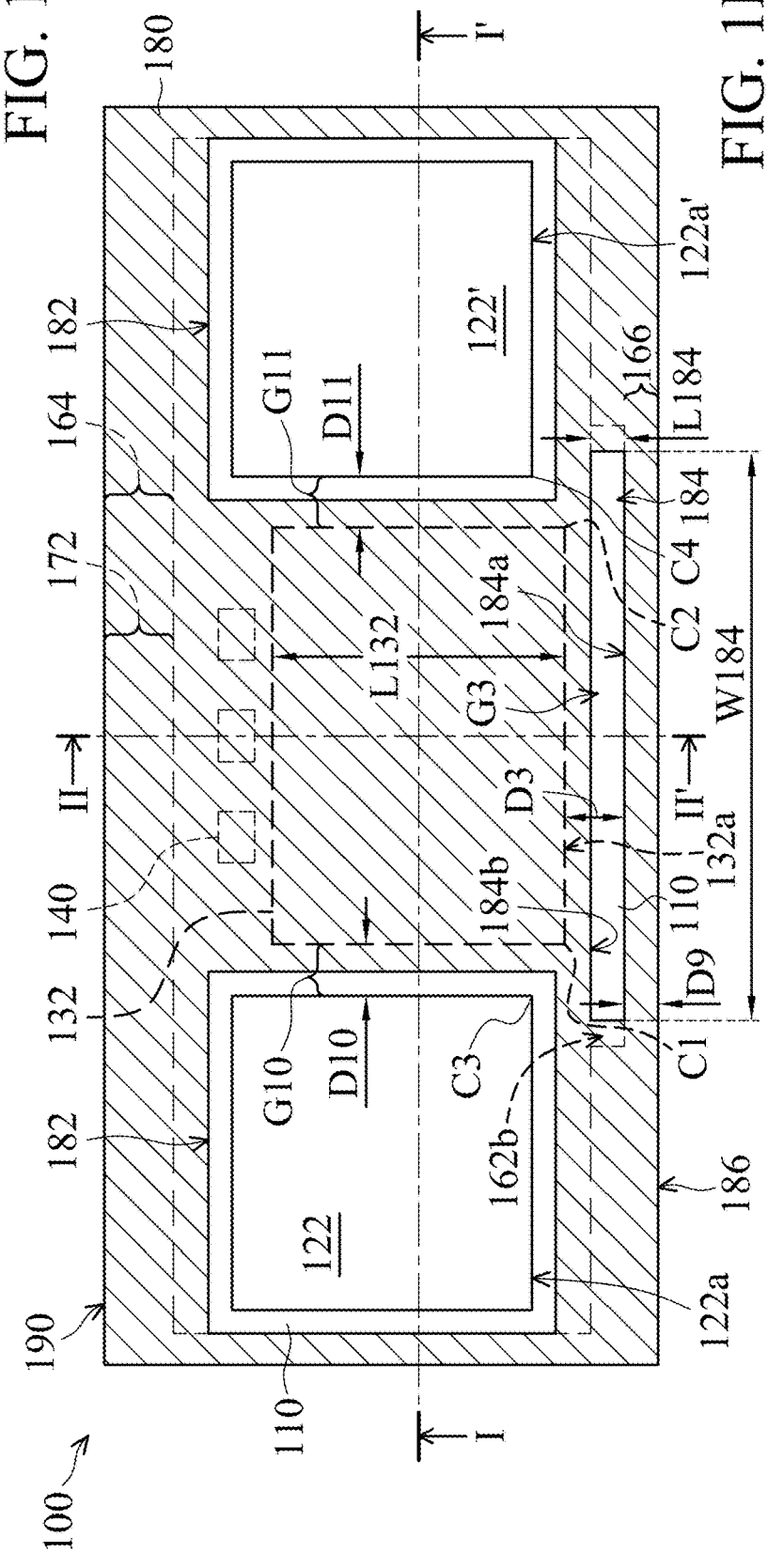

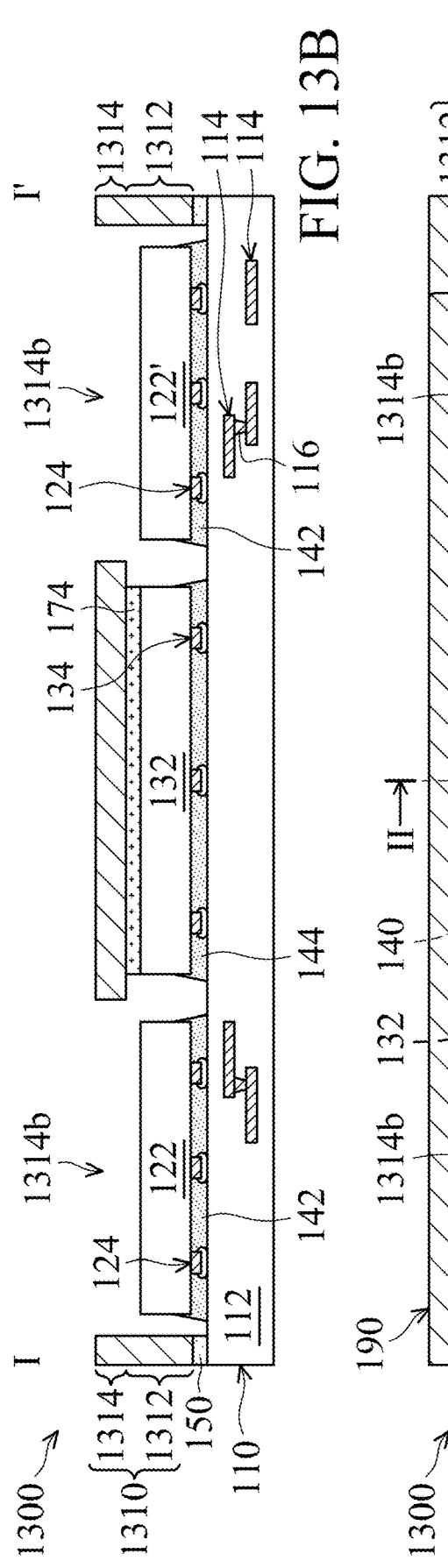
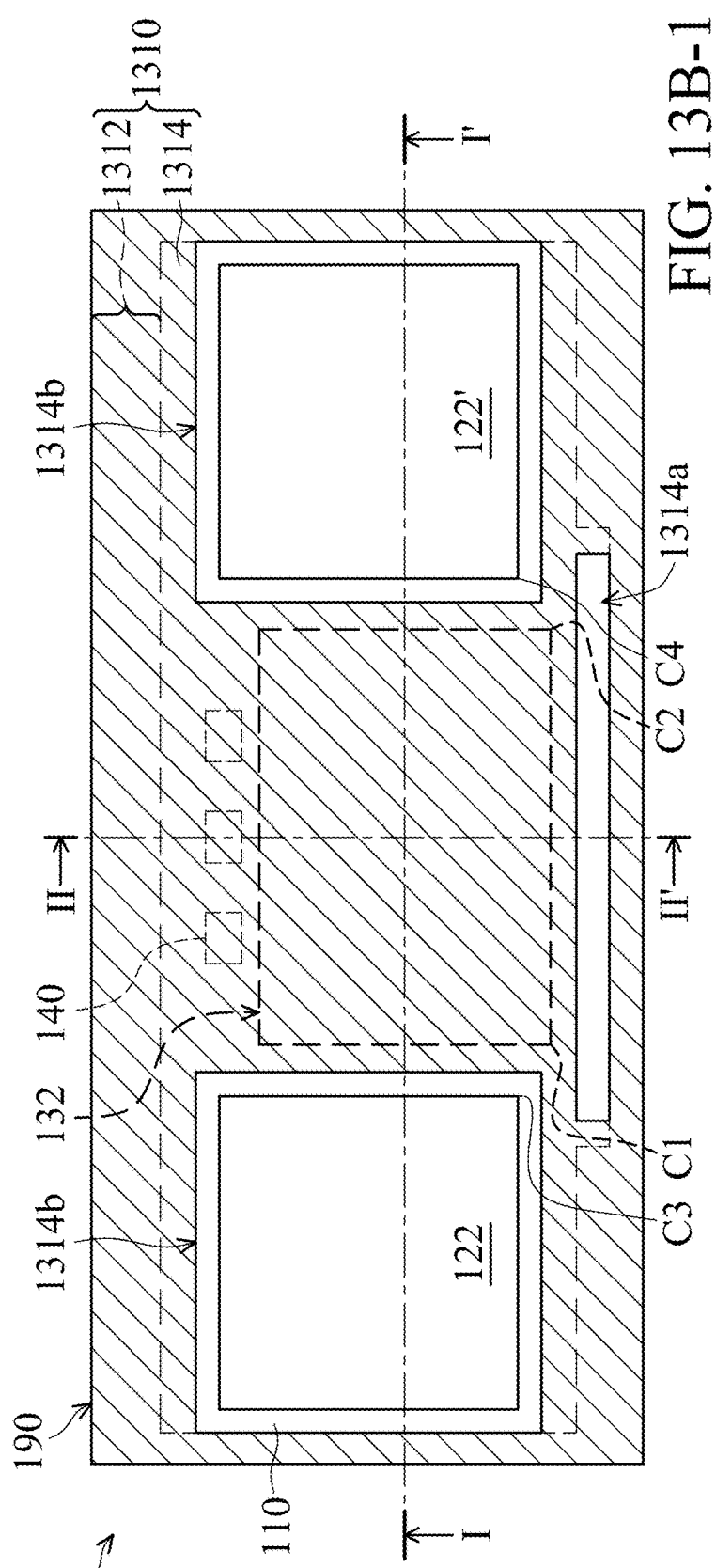
FIG. 13B
FIG. 13B-1

CHIP PACKAGE STRUCTURE WITH LID

CROSS REFERENCE

This application is a Divisional of U.S. application Ser. No. 17/459,347, filed on Aug. 27, 2021, now U.S. Pat. No. 12,033,913, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers 1 using photolithography processes and etching processes to form circuit components and elements thereon.

Many integrated circuits (IC) are typically manufactured on a semiconductor wafer. Technological advances in IC materials and design have produced generations of ICs. Each generation has smaller and more complex circuits than the previous generation. The dies of the wafer may be processed and packaged, and various technologies have been developed for packaging. Since the chip package structure may need to include multiple chips with multiple functions, it is a challenge to form a reliable chip package structure with multiple chips.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1D are cross-sectional views of various stages of a process for forming a chip package structure, in accordance with some embodiments.

FIGS. 1A-1 to 1D-1 are top views of the chip package structure of FIGS. 1A-1D, in accordance with some embodiments.

FIG. 1A-2 is a cross-sectional view illustrating the chip package structure along a sectional line II-II' in FIG. 1A-1, in accordance with some embodiments.

FIG. 1B-2 is a cross-sectional view illustrating the chip package structure along a sectional line II-II' in FIG. 1B-1, in accordance with some embodiments.

FIG. 1D-2 is a cross-sectional view illustrating the chip package structure along a sectional line II-II' in FIG. 1D-1, in accordance with some embodiments.

FIG. 1D-3 is a perspective view illustrating the chip package structure of FIG. 1D, in accordance with some embodiments.

FIGS. 13A-13B are cross-sectional views of various stages of a process for forming a chip package structure, in accordance with some embodiments.

FIGS. 13A-1 to 13B-1 are top views of the chip package structure of FIGS. 13A-13B, in accordance with some embodiments.

FIG. 13B-2 is a cross-sectional view illustrating the chip package structure along a sectional line II-II' in FIG. 13B-1, in accordance with some embodiments.

DETAILED DESCRIPTION

Figures 1, 1A, 2:
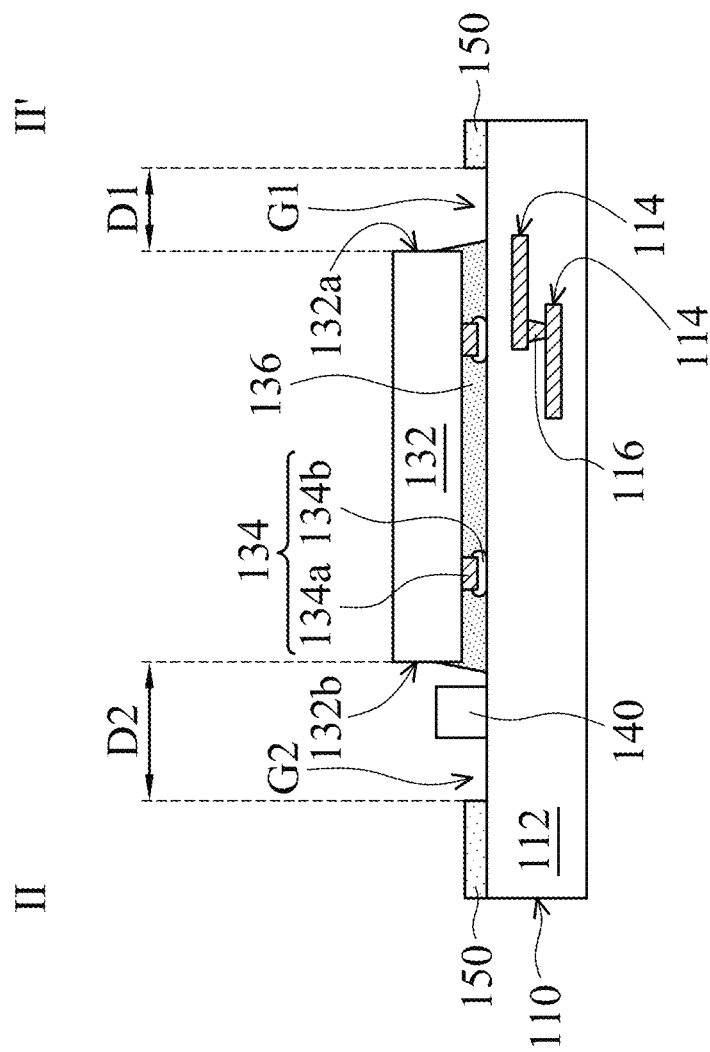

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figures 1, 1B, 2:
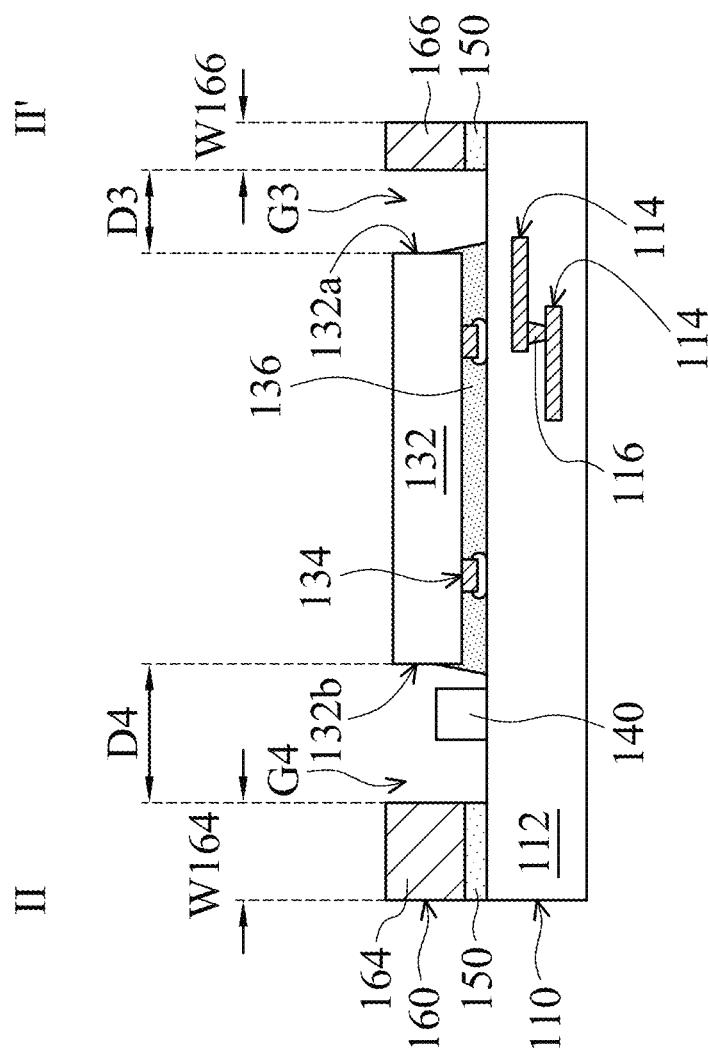
Figure 1C:
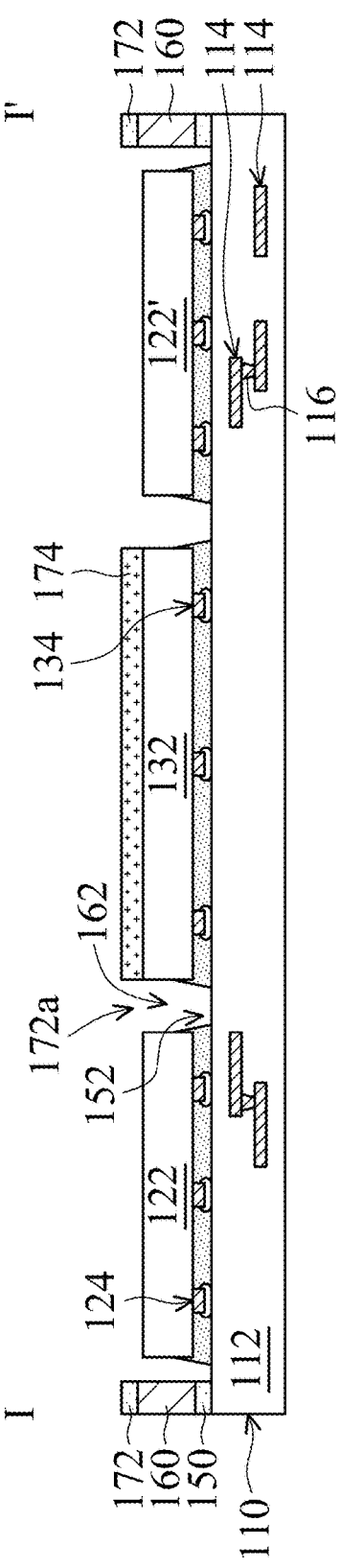
Figures 1, 1C:
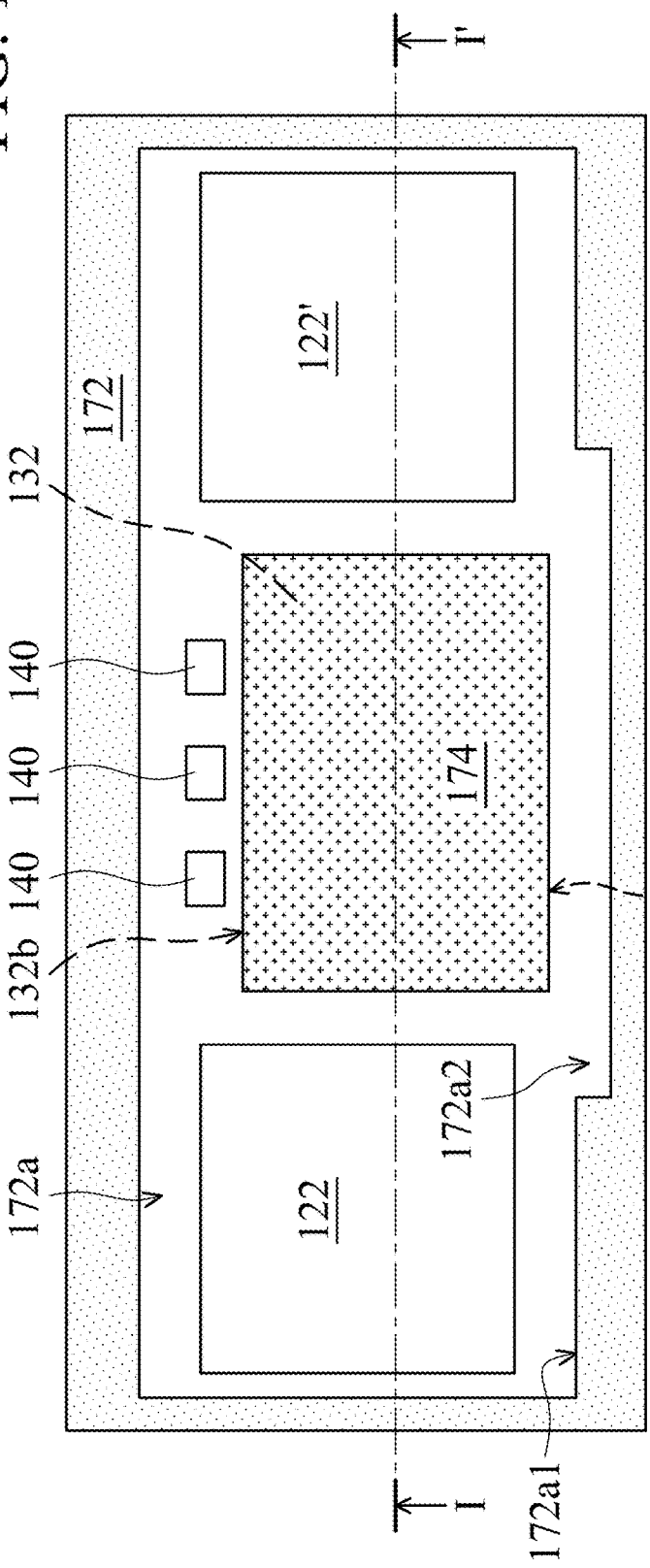
Figures 1, 1D, 2:
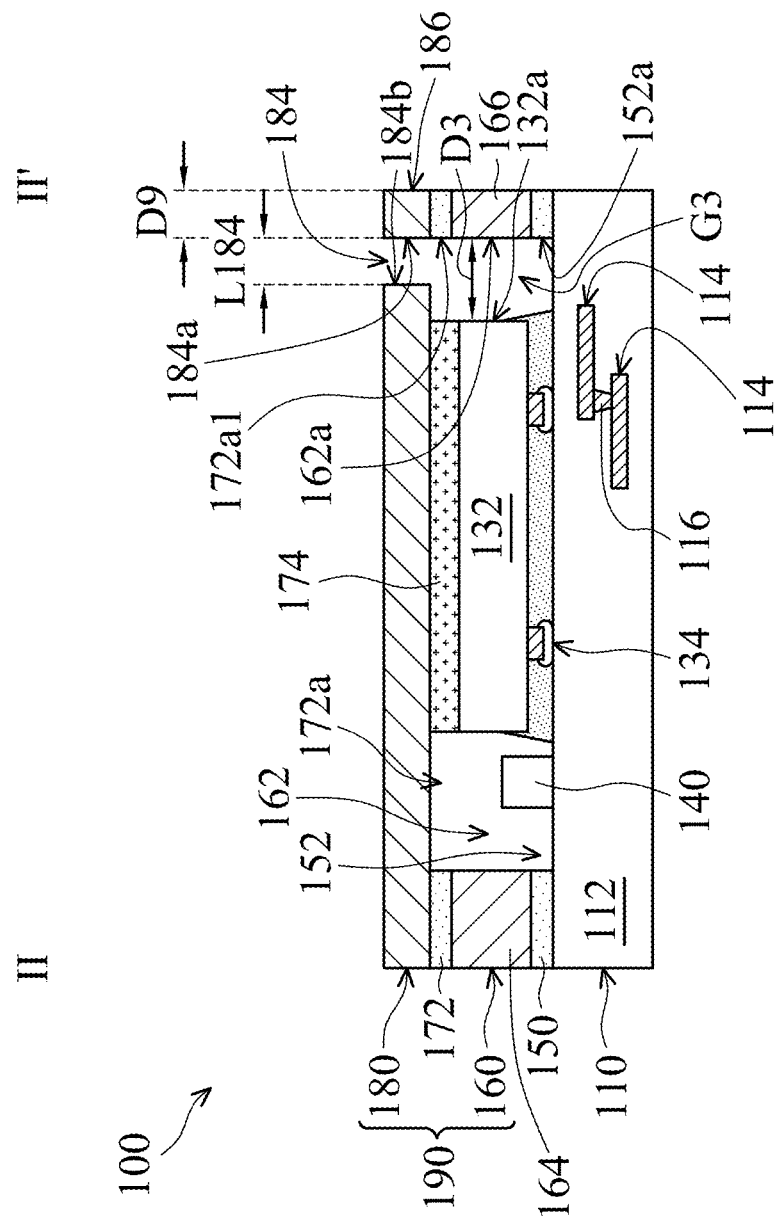
Figures 1, 1D, 2, 3:
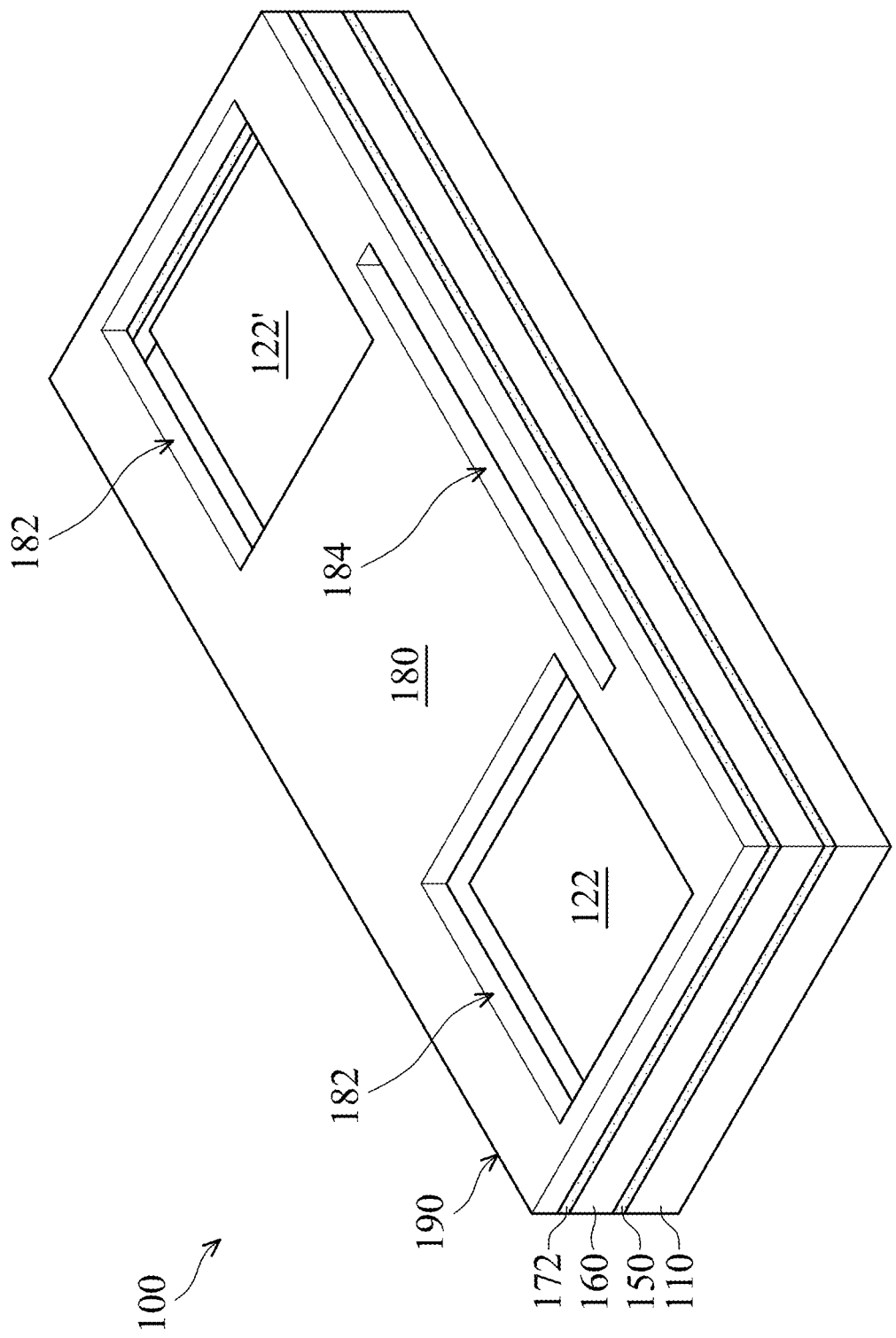

FIGS. 1A-1D are cross-sectional views of various stages of a process for forming a chip package structure, in accordance with some embodiments. FIGS. 1A-1 to 1D-1 are top views of the chip package structure of FIGS. 1A-1D, in accordance with some embodiments. FIGS. 1A-1D are cross-sectional views illustrating the chip package structure along a sectional line I-I' in FIGS. 1A-1 to 1D-1, in accordance with some embodiments.

As shown in FIGS. 1A and 1A-1, a wiring substrate 110 is provided, in accordance with some embodiments. The wiring substrate 110 includes a dielectric structure 112, wiring layers 114, and conductive vias 116, in accordance with some embodiments. The wiring layers 114 and the conductive vias 116 are formed in the dielectric structure 112, in accordance with some embodiments.

The conductive vias 116 are electrically connected between different wiring layers 114, in accordance with some embodiments. For the sake of simplicity, FIG. 1A only shows two of the wiring layers 114, in accordance with some embodiments.

The dielectric structure 112 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric structure 112 is formed using deposition processes (e.g. chemical vapor deposition processes or physical vapor deposition processes), photolithography processes, and etching processes, in accordance with some embodiments.

The wiring layers 114 are made of a conductive material, such as metal (e.g. copper, aluminum, or tungsten) or alloys thereof, in accordance with some embodiments. The conductive vias 116 are made of a conductive material, such as metal (e.g. copper, aluminum, or tungsten) or alloys thereof, in accordance with some embodiments.

In some embodiments, the wiring substrate 110 includes conductive pads (not shown). The conductive pads are formed over the dielectric structure 112, in accordance with some embodiments. The conductive vias 116 are electrically connected between the wiring layer 114 and the conductive pads, in accordance with some embodiments.

The conductive pads are made of a conductive material, such as metal (e.g. copper, aluminum, or tungsten) or alloys thereof, in accordance with some embodiments. In some embodiments, the wiring layers 114, the conductive vias 116, and the conductive pads are made of the same material. In some other embodiments, the wiring layers 114, the conductive vias 116, and the conductive pads are made of different materials.

As shown in FIGS. 1A and 1A-1, chip structures 122, 122', and 132 are bonded to the wiring substrate 110 through conductive connectors 124 and 134, in accordance with some embodiments. The chip structures 122, 122', and 132 are spaced apart from each other by gaps G10 and G11, in accordance with some embodiments.

The chip structure 132 has sidewalls 132a, 132b, 132c, and 132d, in accordance with some embodiments. The chip structure 132 has corners C1 and C2, in accordance with some embodiments. The corner C1 is between the sidewalls 132a and 132c, in accordance with some embodiments. The corner C2 is between the sidewalls 132a and 132d, in accordance with some embodiments.

The chip structure 122 has sidewalls 122a, 122b, 122c, and 122d, in accordance with some embodiments. The chip structure 122 has a corner C3 between the sidewalls 122a and 122d, in accordance with some embodiments. The chip structure 122' has sidewalls 122a', 122b', 122c', and 122d', in accordance with some embodiments. The chip structure 122' has a corner C4 between the sidewalls 122a' and 122c', in accordance with some embodiments.

The chip structures 122, 122', and 132 are chips and/or chip packages, in accordance with some embodiments. In some embodiments, the chip structures 122 and 122' are chip packages, such as dynamic random access memory (DRAM) packages. The chip packages include chip scale packages, such as wafer level chip scale packages. In some embodiments, each chip package includes one chip. In some other embodiments, each chip package includes multiple chips, which are arranged side by side or stacked with each other (e.g., a 3D packaging or a 3DIC device). In some embodiments, the chip structure 132 is a chip, such as a central processing unit (CPU) chip.

The chip of the chip structures 122, 122', and 132 includes a substrate, in accordance with some embodiments. In some embodiments, the substrate is made of an elementary semiconductor material including silicon or germanium in a single crystal structure, a polycrystal structure, or an amorphous structure.

In some other embodiments, the substrate is made of a compound semiconductor, such as silicon carbide, gallium arsenide, gallium phosphide, indium phosphide, indium arsenide, an alloy semiconductor, such as SiGe, or GaAsP, or a combination thereof. The substrate may also include multi-layer semiconductors, semiconductor on insulator (SOI) (such as silicon on insulator or germanium on insulator), or a combination thereof.

In some embodiments, the substrate includes various device elements. In some embodiments, the various device elements are formed in and/or over the substrate. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate. The isolation features are used to define active regions and electrically isolate various device elements formed in and/or over the substrate in the active regions. In some embodiments, the isolation features include shallow trench isolation (STI) features, local oxidation of silicon (LOCOS) features, other suitable isolation features, or a combination thereof.

The conductive connectors 124 are physically and electrically connected between the chip structure 122 or 122' and the wiring substrate 110, in accordance with some embodiments. Each conductive connector 124 includes, for example, a conductive pillar 124a and a solder bump 124b, in accordance with some embodiments.

Each conductive pillar 124a is connected to the chip structure 122 or 122', in accordance with some embodiments. Each solder bump 124b is connected between the corresponding conductive pillar 124a and the wiring substrate 110, in accordance with some embodiments.

The conductive pillars 124a are made of a conductive material such as copper (Cu), aluminum (Al), tungsten (W), cobalt (Co), nickel (Ni), the like, or a combination thereof, in accordance with some embodiments. The conductive pillars 124a are formed using a plating process such as an electroplating process, in accordance with some embodiments. The solder bumps 124b are made of a conductive material such as tin (Sn), the like, or alloys thereof, in accordance with some embodiments.

The conductive connectors 134 are physically and electrically connected between the chip structure 132 and the wiring substrate 110, in accordance with some embodiments. Each conductive connector 134 includes, for example, a conductive pillar 134a and a solder bump 134b, in accordance with some embodiments. Each conductive pillar 134a is connected to the chip structure 132, in accordance with some embodiments. Each solder bump 134b is connected between the conductive pillar 134a and the wiring substrate 110, in accordance with some embodiments.

The conductive pillars 134a are made of a conductive material such as copper (Cu), aluminum (Al), tungsten (W), cobalt (Co), nickel (Ni), the like, or a combination thereof, in accordance with some embodiments. The conductive pillars 134a are formed using a plating process such as an electroplating process, in accordance with some embodiments. The solder bumps 134b are made of a conductive material such as tin (Sn), the like, or alloys thereof, in accordance with some embodiments.

FIG. 1A-2 is a cross-sectional view illustrating the chip package structure along a sectional line II-II' in FIG. 1A-1, in accordance with some embodiments. As shown in FIGS. 1A-1 and 1A-2, devices 140 are bonded to the wiring substrate 110 by, for example, surface mount technology (SMT), in accordance with some embodiments. The devices 140 include passive devices, other suitable devices, or combinations thereof. The passive devices include resistors, capacitors, inductors, or other suitable passive devices.

As shown in FIG. 1A, an underfill layer 142 is formed between the chip structures 122 and 122' and the wiring substrate 110, in accordance with some embodiments. The underfill layer 142 surrounds the conductive connectors 124 and the chip structures 122 and 122', in accordance with some embodiments. The underfill layer 142 is made of an insulating material, such as a polymer material, in accordance with some embodiments.

As shown in FIGS. 1A and 1A-2, an underfill layer 144 is formed between the chip structure 132 and the wiring substrate 110, in accordance with some embodiments. The underfill layer 144 surrounds the conductive connectors 134 and the chip structure 132, in accordance with some embodiments. The underfill layer 144 is made of an insulating material, such as a polymer material, in accordance with some embodiments.

For the sake of simplicity, FIG. 1A-1 omits depicting the underfill layers 142 and 144, in accordance with some embodiments. Similarly, FIGS. 1B-1 to 1D-1, 2A, 3A, 4-9, 10A, 11A, 12A, 13A-1, and 13B-1 omit depicting the underfill layers 142 and 144, in accordance with some embodiments.

As shown in FIGS. 1A and 1A-1, an adhesive layer 150 is formed over the wiring substrate 110, in accordance with some embodiments. As shown in FIG. 1A-1, the adhesive layer 150 has a ring shape, in accordance with some embodiments. The adhesive layer 150 has an opening 152, in accordance with some embodiments. The chip structures 122, 122', and 132 are in the opening 152, in accordance with some embodiments.

The opening 152 has an inner wall 152a, in accordance with some embodiments. The inner wall 152a has a recess 152b, in accordance with some embodiments. The recess 152b faces the chip structure 132, in accordance with some embodiments. The recess 152b faces the corners C1 and C2 of the chip structure 132, the corner C3 of the chip structure 122, and the corner C4 of the chip structure 122', in accordance with some embodiments.

As shown in FIGS. 1A-1 and 1A-2, the sidewall 132a of the chip structure 132 is spaced apart from the adhesive layer 150 by a gap G1, in accordance with some embodiments. The sidewall 132b of the chip structure 132 is spaced apart from the adhesive layer 150 by a gap G2, in accordance with some embodiments.

The gap G1 is narrower than the gap G2, in accordance with some embodiments. That is, a distance D1 between the sidewall 132a and the adhesive layer 150 is less than a distance D2 between the sidewall 132b and the adhesive layer 150, in accordance with some embodiments. The adhesive layer 150 is made of a polymer (e.g., epoxy or silicone) or a combination of polymer and metal (e.g., a silver paste), in accordance with some embodiments.

As shown in FIGS. 1B and 1B-1, a ring structure 160 is disposed over the adhesive layer 150, in accordance with some embodiments. The adhesive layer 150 is adhered between the ring structure 160 and the wiring substrate 110, in accordance with some embodiments. The ring structure 160 has an opening 162, in accordance with some embodiments. The chip structures 122, 122', and 132 are in the opening 162, in accordance with some embodiments. The ring structure 160 surrounds the chip structures 122, 122', and 132, in accordance with some embodiments.

The opening 162 has an inner wall 162a, in accordance with some embodiments. The inner wall 162a has a recess 162b, in accordance with some embodiments. The recess 162b faces the chip structure 132, in accordance with some embodiments. The recess 162b faces the corners C1 and C2 of the chip structure 132, the corner C3 of the chip structure 122, and the corner C4 of the chip structure 122', in accordance with some embodiments.

FIG. 1B-2 is a cross-sectional view illustrating the chip package structure along a sectional line II-II' in FIG. 1B-1, in accordance with some embodiments. As shown in FIGS. 1B-1 and 1B-2, the ring structure 160 has portions 164 and 166, in accordance with some embodiments. In some embodiments, a line width W166 of the portion 166 is less than a line width W164 of the portion 164.

The portion 164 is also referred to as a wide portion, and the portion 166 is also referred to as a narrow portion, in accordance with some embodiments. The chip structures 122, 122', and 132 are between the portions 164 and 166, in accordance with some embodiments.

The sidewall 132a of the chip structure 132 is spaced apart from the portion 166 by a gap G3, in accordance with some embodiments. The sidewall 132b of the chip structure 132 is spaced apart from the portion 164 by a gap G4, in accordance with some embodiments. The gap G3 is narrower than the gap G4, in accordance with some embodiments. That is, the portion 166 is closer to the chip structure 132 than the portion 164, in accordance with some embodiments. In some embodiments, a distance D3 between the sidewall 132a and the portion 166 is less than a distance D4 between the sidewall 132b and the portion 164, in accordance with some embodiments. In some embodiments, a difference between the distances D4 and D3 ranges from about 1 μm to about 5500 μm.

As shown in FIG. 1B-1, the sidewall 122a of the chip structure 122 is spaced apart from the ring structure 160 by a gap G5, in accordance with some embodiments. The sidewall 122b of the chip structure 122 is spaced apart from the ring structure 160 by a gap G6, in accordance with some embodiments. The gaps G5 and G6 have substantially the same width, in accordance with some embodiments. That is, a distance D5 between the sidewall 122a and the ring structure 160 is substantially equal to a distance D6 between the sidewall 122b and the ring structure 160, in accordance with some embodiments.

Similarly, as shown in FIG. 1B-1, the sidewall 122a' of the chip structure 122' is spaced apart from the ring structure 160 by a gap G5', in accordance with some embodiments. The sidewall 122b' of the chip structure 122' is spaced apart from the ring structure 160 by a gap G6', in accordance with some embodiments. The gaps G5' and G6' have substantially the same width, in accordance with some embodiments. That is, a distance D5' between the sidewall 122a' and the ring structure 160 is substantially equal to a distance D6' between the sidewall 122b' and the ring structure 160, in accordance with some embodiments.

The ring structure 160 is made of a rigid material, such as metal (e.g., copper or iron), alloys thereof (e.g., stainless steel), or another suitable material which is more rigid than the wiring substrate 110, in accordance with some embodiments.

As shown in FIGS. 1C and 1C-1, an adhesive layer 172 is formed over the ring structure 160, in accordance with some embodiments. The adhesive layer 172 is made of a polymer (e.g., epoxy or silicone) or a combination of polymer and metal (e.g., a silver paste), in accordance with some embodiments.

As shown in FIGS. 1C and 1C-1, an adhesive layer 174 is formed over the chip structure 132, in accordance with some embodiments. The adhesive layer 174 is made of a combination of polymer and metal (e.g., a silver paste) or a polymer (e.g., epoxy or silicone), in accordance with some embodiments. In some embodiments, the adhesive layers 172 and 174 are made of different materials. In some other embodiments, the adhesive layers 172 and 174 are made of the same material.

As shown in FIGS. 1D and 1D-1, a top plate 180 is disposed over the adhesive layers 172 and 174, in accordance with some embodiments. The top plate 180, the adhesive layer 172, and the ring structure 160 together form a heat-spreading lid 190, in accordance with some embodiments. In this step, a chip package structure 100 is substantially formed, in accordance with some embodiments.

The adhesive layer 172 is adhered between the ring structure 160 and the top plate 180, in accordance with some embodiments. The adhesive layer 174 is adhered between the chip structure 132 and the top plate 180, in accordance with some embodiments. The top plate 180 covers the ring structure 160 and the chip structure 132, in accordance with some embodiments.

The top plate 180 has openings 182 and 184, in accordance with some embodiments. The openings 182 expose the chip structures 122 and 122' respectively, in accordance with some embodiments. FIG. 1D-2 is a cross-sectional view illustrating the chip package structure along a sectional line II-II' in FIG. 1D-1, in accordance with some embodiments. As shown in FIGS. 1D-1 and 1D-2, the opening 184 is over the gap G3, which is between the sidewall 132a of the chip structure 132 and the portion 166, in accordance with some embodiments.

As shown in FIG. 1D-1, a first portion of the opening 184 is between the portion 166 and the chip structure 132, in accordance with some embodiments. In some embodiments, a second portion of the opening 184 is between the portion 166 and the gap G10, which is between the chip structures 122 and 132. In some embodiments, a third portion of the opening 184 is between the portion 166 and the chip structure 122.

In some embodiments, a fourth portion of the opening 184 is between the portion 166 and the gap G11, which is between the chip structures 122' and 132. In some embodiments, a fifth portion of the opening 184 is between the portion 166 and the chip structure 122'. The opening 184 is between the portion 166 and the corners C1, C2, C3 and C4, in accordance with some embodiments.

As shown in FIGS. 1D and 1D-1, a width W184 of the opening 184 is greater than a sum of a width D10 of the gap G10, a width D11 of the gap G11, and a width W132 of the chip structure 132, in accordance with some embodiments. In some embodiments, a length L184 of the opening 184 is less than a length L132 of the chip structure 132. The width W184 is greater than the length L184, in accordance with some embodiments. The width W184 is greater than a distance D9 between the opening 184 and a sidewall 186 of the top plate 180, in accordance with some embodiments.

As shown in FIG. 1D-1, the gaps G10 and G11 extend toward the opening 184, in accordance with some embodiments. In some embodiments, the opening 184 has a strip shape. The opening 184 has inner walls 184a and 184b facing each other, in accordance with some embodiments. The inner wall 184b is between the inner wall 184a and the sidewall 132a of the chip structure 132, in accordance with some embodiments. The inner walls 184a and 184b are both between the sidewall 132a and the ring structure 160, in accordance with some embodiments.

FIG. 1D-3 is a perspective view illustrating the chip package structure of FIG. 1D, in accordance with some embodiments. As shown in FIGS. 1D-1, 1D-2, and 1D-3, the opening 184 dose not overlap with the chip structure 122, 122', and 132, in accordance with some embodiments. That is, the opening 184 dose not expose the chip structure 122, 122', and 132, in accordance with some embodiments. In some embodiments, the inner walls 184a, 172a1, 162a, and 152a of the openings 184, 172a, 162, and 152 of the top plate 180, the adhesive layer 172, the ring structure 160, and the adhesive layer 150 are substantially aligned with or level with or coplanar to each other.

The top plate 180 is made of a rigid material, such as metal (e.g., copper or iron), alloys thereof (e.g., stainless steel), or another suitable material which is more rigid than the wiring substrate 110, in accordance with some embodiments.

The coefficient of thermal expansion of the chip structures 122, 122', and 132 ranges from about 1 ppm/° C. to about 5 ppm/° C., in accordance with some embodiments. The coefficient of thermal expansion of the heat-spreading lid 190 ranges from about 12 ppm/° C. to about 22 ppm/° C., in accordance with some embodiments.

The coefficient of thermal expansion of the wiring substrate 110 ranges from about 10 ppm/° C. to about 20 ppm/° C., in accordance with some embodiments. The difference between the coefficients of thermal expansion of the chip structures 122, 122', and 132 and the heat-spreading lid 190 (or the wiring substrate 110) is large, in accordance with some embodiments.

The coefficient of thermal expansion mismatch between the chip structures 122, 122', and 132 and the heat-spreading lid 190 (or the wiring substrate 110) tends to result in a thermal stress, in accordance with some embodiments. Since the portion 166 (of the ring structure 160) is closer to the chip structure 132 than the portion 164, the thermal stress in the adhesive layers 150 and 172 close to the portion 166 is greater than the thermal stress in the adhesive layers 150 and 172 close to the portion 164, in accordance with some embodiments. Therefore, the thermal stress tends to induce cracks in the adhesive layers 150 and 172 close to the portion 166 and delamination between the adhesive layers 150 and 172 close to the portion 166 and the elements adjacent thereto (e.g., the wiring substrate 110, the ring structure 160, and the top plate 180), in accordance with some embodiments.

Since the thermal stress is transmitted from the chip structure 132 to the portion 166 through the top plate 180 and the wiring substrate 110, the formation of the opening 184 in the top plate 180 between the chip structure 132 and the portion 166 is able to hinder the transmission of the thermal stress, in accordance with some embodiments. The opening 184 is also able to release the thermal stress, in accordance with some embodiments. Therefore, the opening 184 reduces the thermal stress in the adhesive layers 150 and 172 close to the portion 166, in accordance with some embodiments.

As a result, the opening 184 prevents the adhesive layers 150 and 172 close to the portion 166 from delamination and developing cracks in subsequent thermal processes, in accordance with some embodiments. Therefore, the opening 184 improves the reliability of the adhesive layers 150 and 172, in accordance with some embodiments.

In some embodiments, the length L184 of the opening 184 is greater than the distance D9 between the opening 184 and the sidewall 186 of the top plate 180. If the length L184 is greater than the distance D9, the transmission path length of the thermal stress from the corner C1 or C2 to the portion 166 of the ring structure 160 is increased, which hinders the transmission of the thermal stress from the corners C1 and C2 to the portion 166, in accordance with some embodiments.

In some embodiments, the length L184 of the opening 184 is equal to or less than the distance D9 between the opening 184 and the sidewall 186 of the top plate 180. If the length L184 is equal to or less than the distance D9, the design of the opening 184 is able to retain more heat dissipation area of the top plate 180 close to the chip structure 132, in accordance with some embodiments.

As shown in FIGS. 1D-1 and 1D-2, the formation of the recess 162b of the ring structure 160 is able to enlarge the distance D3 between the chip structure 132 and the portion 166 of the ring structure 160, which reduces the thermal stress in the adhesive layers 150 and 172 close to the portion 166, in accordance with some embodiments.

In some embodiments, the great thermal stress is at the corners (e.g., C1 and C2) of the chip structure 132. The opening 184 is between the corners C1 and C2 and the portion 166 of the ring structure 160 to hinder the transmission of the thermal stress from the corners C1 and C2 to the portion 166, in accordance with some embodiments.

Figure 2A:
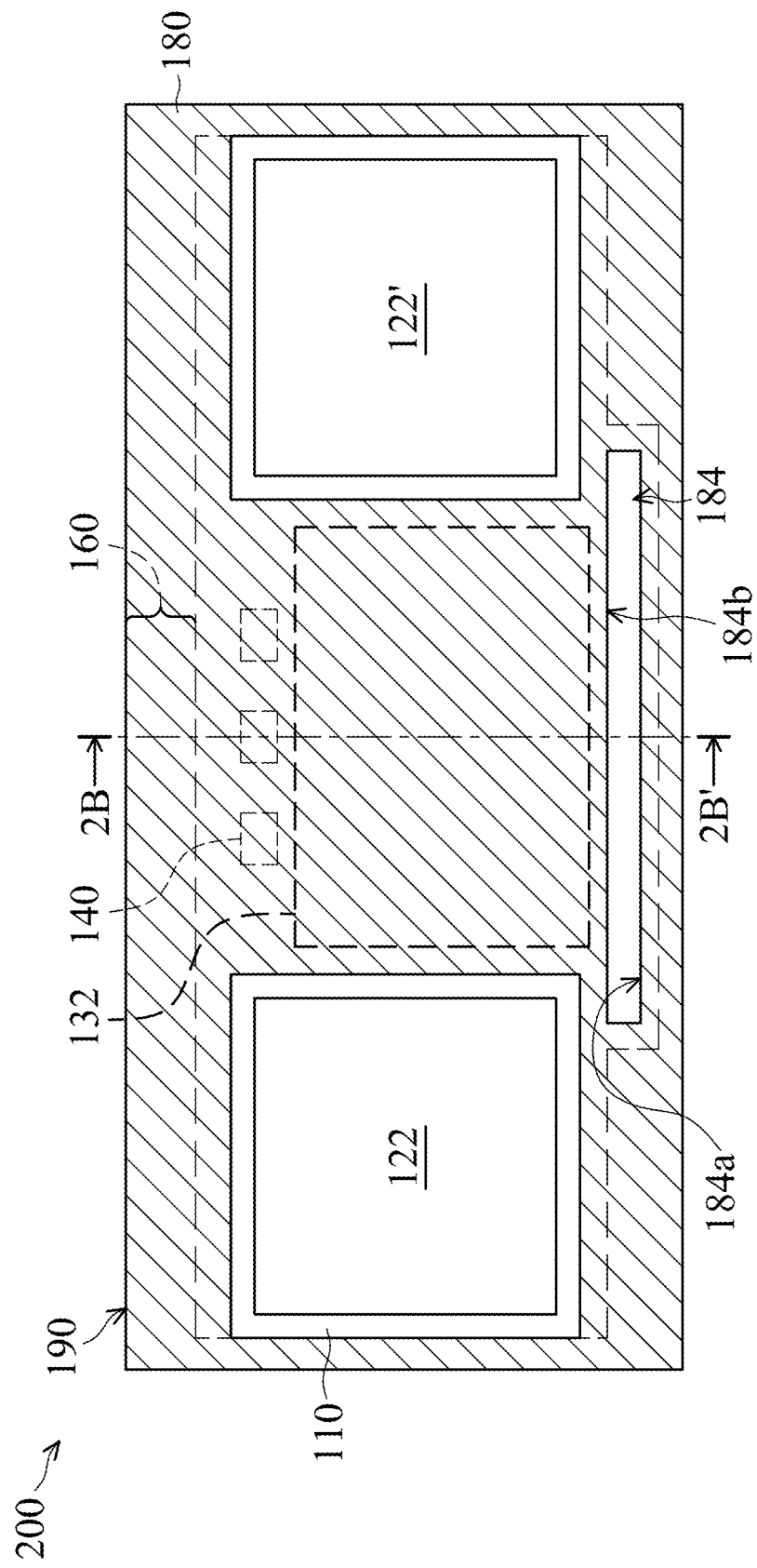
FIG. 2A is a top view of a chip package structure, in accordance with some embodiments.
Figure 2B:
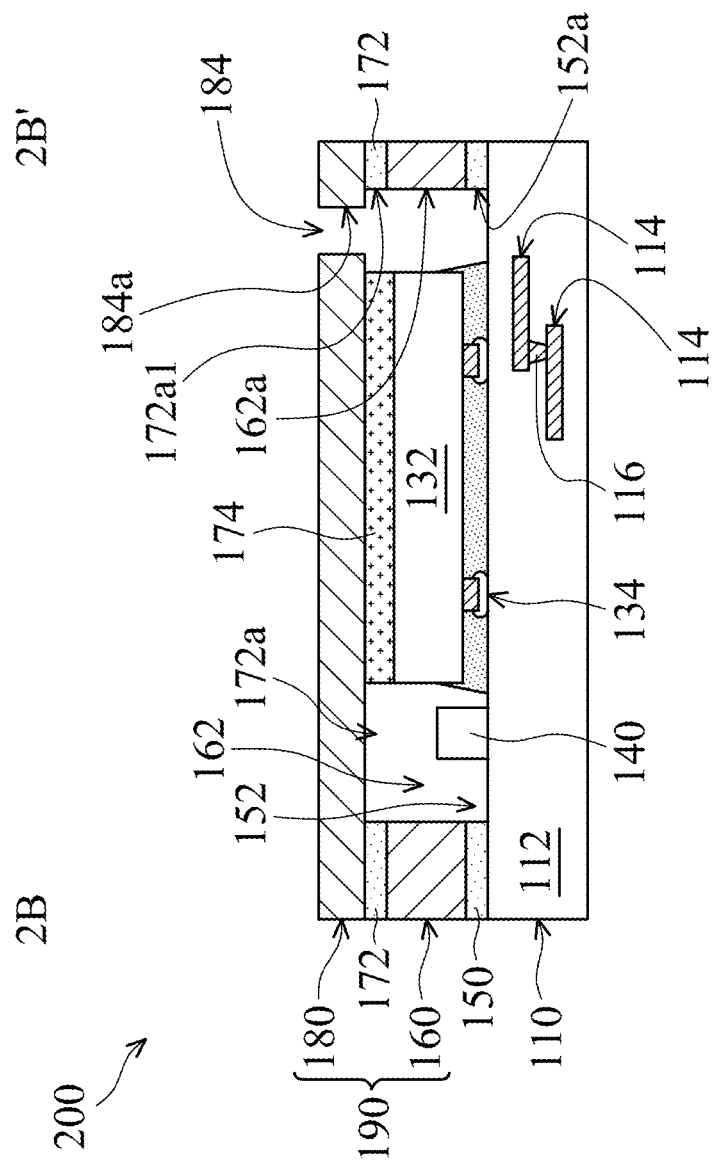
FIG. 2B is a cross-sectional view illustrating the chip package structure along a sectional line 2B-2B' in FIG. 2A, in accordance with some embodiments.

FIG. 2A is a top view of a chip package structure 200, in accordance with some embodiments. FIG. 2B is a cross-sectional view illustrating the chip package structure 200 along a sectional line 2B-2B' in FIG. 2A, in accordance with some embodiments.

As shown in FIGS. 2A and 2B, the chip package structure 200 is similar to the chip package structure 100 of FIGS. 1D-1 and 1D-2, except that the inner wall 184a of the opening 184 of the top plate 180 is not aligned with the inner walls 172a1, 162a, and 152a of the openings 172a, 162, and 152 of the adhesive layer 172, the ring structure 160, and the adhesive layer 150, in accordance with some embodiments.

Figure 3A:
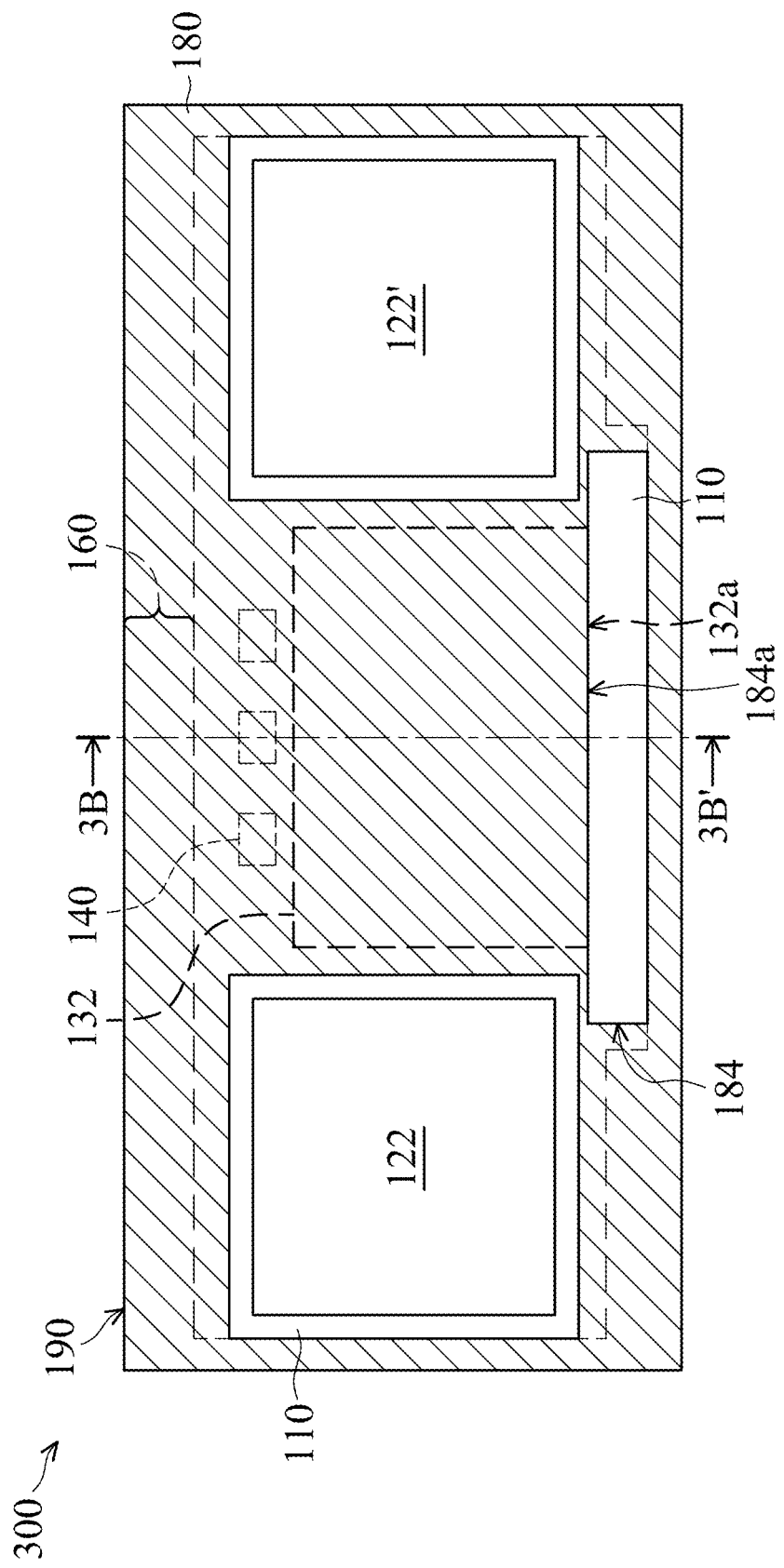
FIG. 3A is a top view of a chip package structure, in accordance with some embodiments.
Figure 3B:
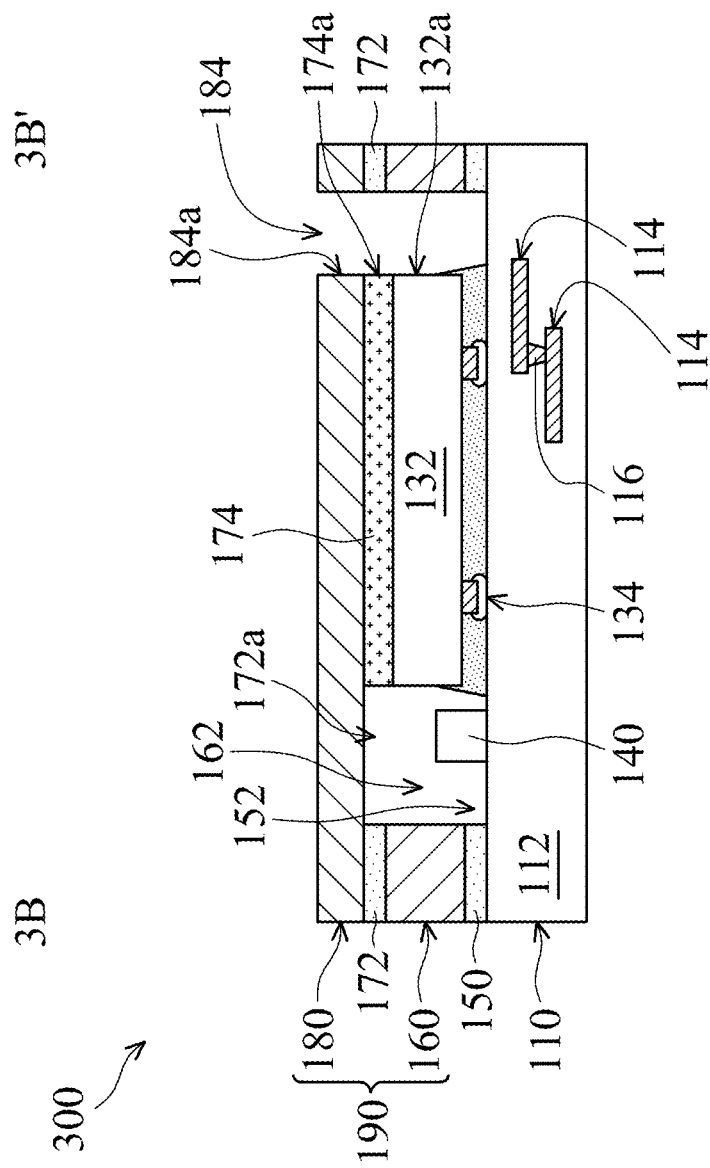
FIG. 3B is a cross-sectional view illustrating the chip package structure along a sectional line 3B-3B' in FIG. 3A, in accordance with some embodiments.

FIG. 3A is a top view of a chip package structure 300, in accordance with some embodiments. FIG. 3B is a cross-sectional view illustrating the chip package structure 300 along a sectional line 3B-3B' in FIG. 3A, in accordance with some embodiments.

As shown in FIGS. 3A and 3B, the chip package structure 300 is similar to the chip package structure 100 of FIGS. 1D-1 and 1D-2, except that the inner wall 184a of the opening 184 of the top plate 180 is substantially aligned with or level with or coplanar to sidewalls 174a and 132a of the adhesive layer 174 and the chip structure 132, in accordance with some embodiments.

Figure 4:
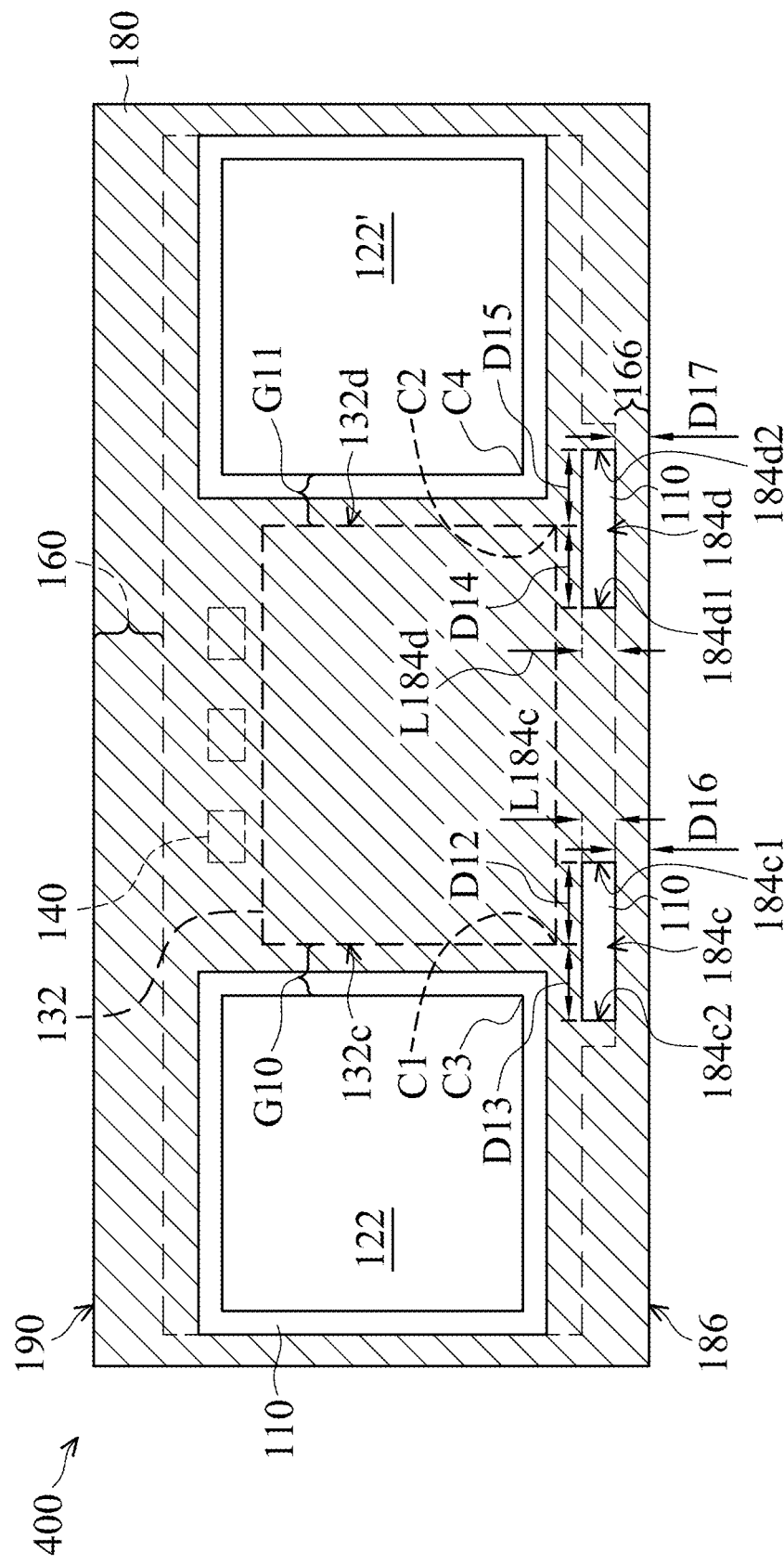
FIG. 4 is a top view of a chip package structure, in accordance with some embodiments.

FIG. 4 is a top view of a chip package structure 400, in accordance with some embodiments. As shown in FIG. 4, the chip package structure 400 is similar to the chip package structure 100 of FIG. 1D-1, except that the top plate 180 of the chip package structure 400 has openings 184c and 184d spaced apart from each other, in accordance with some embodiments. The top plate 180 of the chip package structure 400 does not have the opening 184 of the top plate 180 of the chip package structure 100 of FIG. 1D-1, in accordance with some embodiments.

The opening 184c is between the corner C1 and the portion 166 of the ring structure 160, in accordance with some embodiments. The opening 184c has opposite inner walls 184c1 and 184c2, in accordance with some embodiments. In some embodiments, a lateral distance D12 between the sidewall 132c of the chip structure 132 and the inner wall 184c1 is substantially equal to a lateral distance D13 between the sidewall 132c and the inner wall 184c2.

The opening 184c is able to hinder the transmission of the thermal stress from the corner C1 to the portion 166, in accordance with some embodiments. In some embodiments, the lateral distance D12 or D13 is greater than a distance D16 between the opening 184c and the sidewall 186 of the top plate 180. In some embodiments, a length L184c of the opening 184c is greater than the distance D16. If the distance D12 or D13 or the length L184c is greater than the distance D16, the transmission path length of the thermal stress from the corner C1 to the portion 166 of the ring structure 160 is increased, which further hinders the transmission of the thermal stress from the corner C1 to the portion 166, in accordance with some embodiments.

In some embodiments, the lateral distance D12 or D13 is equal to or less than the distance D16. In some embodiments, the length L184c is equal to or less than the distance D16. If the distance D12 or D13 or the length L184c is equal to or less than the distance D16, the design of the opening 184c is able to retain more heat dissipation area of the top plate 180 close to the chip structure 132, in accordance with some embodiments. In some embodiments, the opening 184c is between the corner C3 of the chip structure 122 and the portion 166 of the ring structure 160.

The opening 184d is between the corner C2 and the portion 166 of the ring structure 160, in accordance with some embodiments. The opening 184d has opposite inner walls 184d1 and 184d2, in accordance with some embodiments. In some embodiments, a lateral distance D14 between the sidewall 132d of the chip structure 132 and the inner wall 184d1 is substantially equal to a lateral distance D15 between the sidewall 132d and the inner wall 184d2.

The opening 184d is able to hinder the transmission of the thermal stress from the corner C2 to the portion 166, in accordance with some embodiments. In some embodiments, the lateral distance D14 or D15 is greater than a distance D17 between the opening 184d and the sidewall 186 of the top plate 180. In some embodiments, a length L184d of the opening 184d is greater than the distance D17. If the distance D14 or D15 or the length L184d is greater than the distance D17, the transmission path length of the thermal stress from the corner C2 to the portion 166 of the ring structure 160 is increased, which further hinders the transmission of the thermal stress from the corner C2 to the portion 166, in accordance with some embodiments.

In some embodiments, the lateral distance D14 or D15 is equal to or less than the distance D17. In some embodiments, the length L184d of the opening 184d is equal to or less than the distance D17. If the distance D14 or D15 or the length L184d is equal to or less than the distance D17, the design of the opening 184d is able to retain more heat dissipation area of the top plate 180 close to the chip structure 132, in accordance with some embodiments. In some embodiments, the opening 184d is between the corner C4 of the chip structure 122' and the portion 166 of the ring structure 160.

Figure 5:
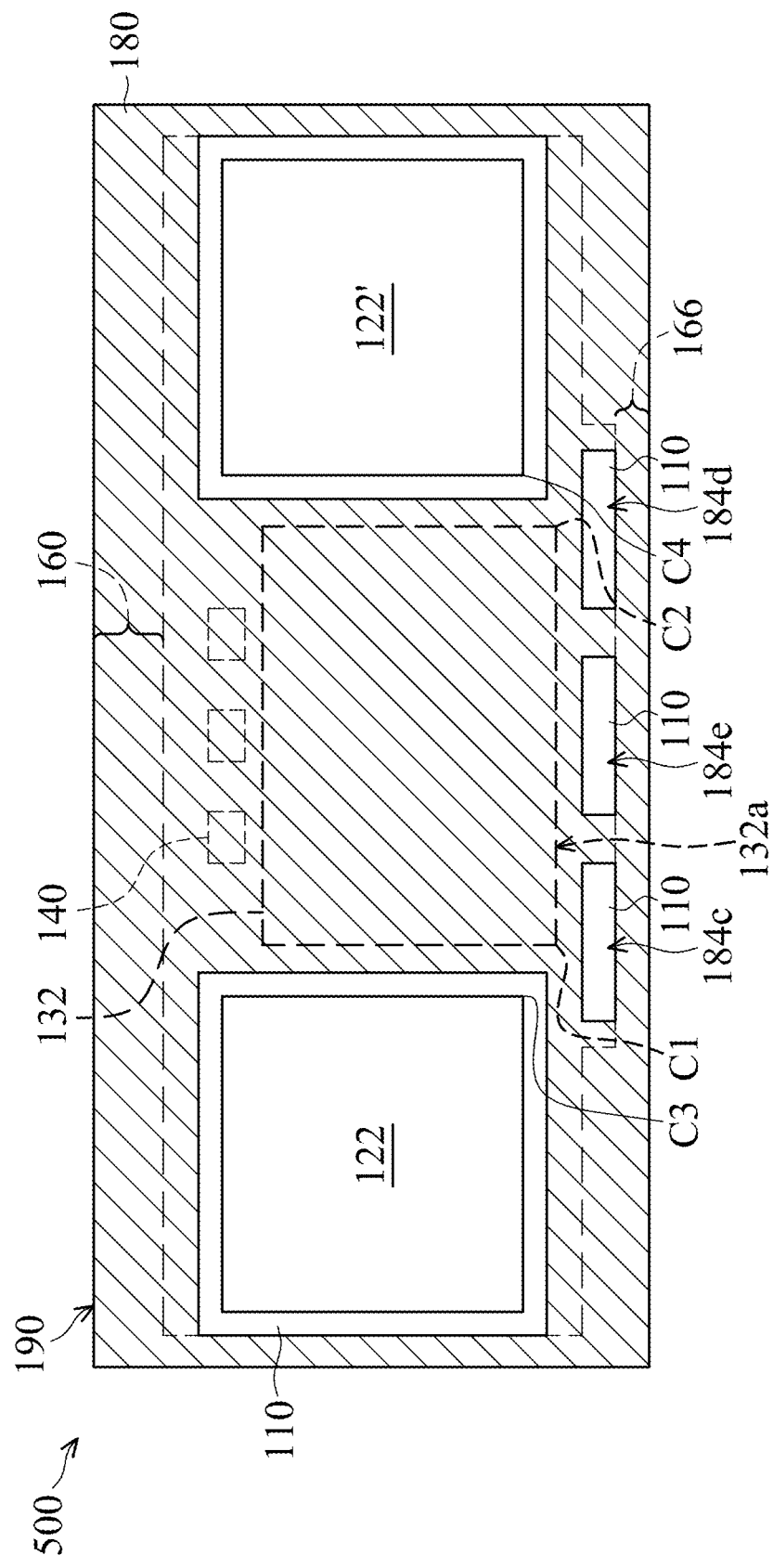
FIG. 5 is a top view of a chip package structure, in accordance with some embodiments.

FIG. 5 is a top view of a chip package structure 500, in accordance with some embodiments. As shown in FIG. 5, the chip package structure 500 is similar to the chip package structure 400 of FIG. 4, except that the top plate 180 of the chip package structure 500 further has an opening 184e between the openings 184c and 184d, in accordance with some embodiments.

The openings 184c, 184d, and 184e are spaced apart from each other, in accordance with some embodiments. The opening 184e is between the sidewall 132a of the chip structure 132 and the portion 166 of the ring structure 160, in accordance with some embodiments. The opening 184e is able to hinder the transmission of the thermal stress from the sidewall 132a to the portion 166, in accordance with some embodiments.

Figure 6:
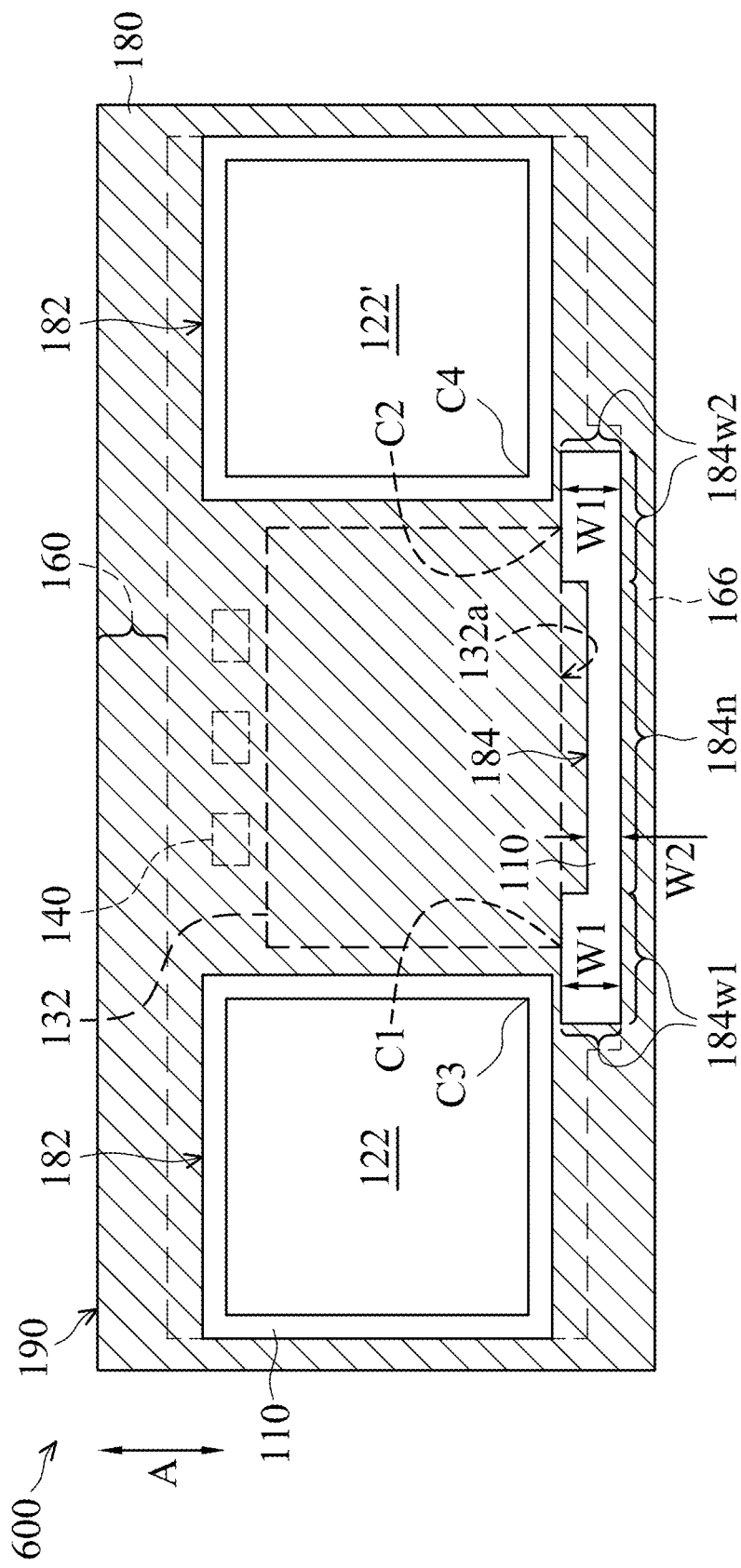
FIG. 6 is a top view of a chip package structure, in accordance with some embodiments.

FIG. 6 is a top view of a chip package structure 600, in accordance with some embodiments. As shown in FIG. 6, the chip package structure 600 is similar to the chip package structure 100 of FIG. 1D-1, except that the opening 184 of the top plate 180 of the chip package structure 600 has a U-shape, in accordance with some embodiments.

Specifically, the opening 184 has wide portions 184w1 and 184w2 and a narrow portion 184n, in accordance with some embodiments. The narrow portion 184n is connected between the wide portions 184w1 and 184w2, in accordance with some embodiments. The wide portion 184w1 or 184w2 is wider than the narrow portion 184n, in accordance with some embodiments. That is, a width W1 of the wide portion 184w1 or 184w2 is greater than a width W2 of the narrow portion 184n, in accordance with some embodiments.

The wide portion 184w1 is closer to the corner C1 of the chip structure 132 than the narrow portion 184n, in accordance with some embodiments. The wide portion 184w1 is between the corner C1 and the portion 166 of the ring structure 160, in accordance with some embodiments. The wide portion 184w2 is closer to the corner C2 of the chip structure 132 than the narrow portion 184n, in accordance with some embodiments. The wide portion 184w2 is between the corner C2 and the portion 166 of the ring structure 160, in accordance with some embodiments.

Since the width W1 of the wide portion 184w1 or 184w2 is large, the transmission path length of the thermal stress from the corner C1 or C2 to the portion 166 of the ring structure 160 is increased, which hinders the transmission of the thermal stress from the corners C1 and C2 to the portion 166, in accordance with some embodiments. The design of the narrow portion 184 is able to retain more heat dissipation area of the top plate 180 close to the chip structure 132, in accordance with some embodiments.

Figure 7:
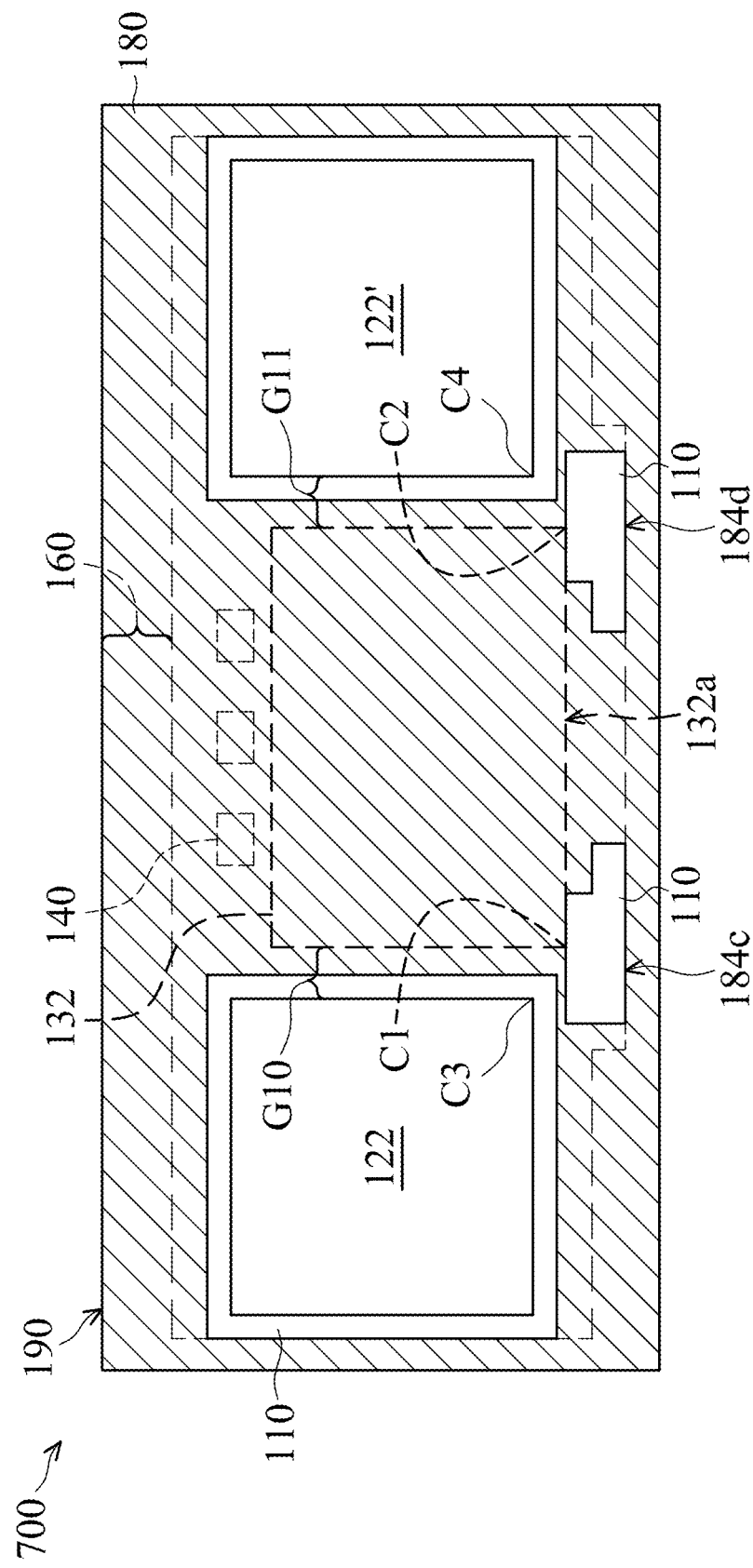
FIG. 7 is a top view of a chip package structure, in accordance with some embodiments.

FIG. 7 is a top view of a chip package structure 700, in accordance with some embodiments. As shown in FIG. 7, the chip package structure 700 is similar to the chip package structure 400 of FIG. 4, except that the openings 184c and 184d of the top plate 180 of the chip package structure 700 has an L-shape.

Figure 8:
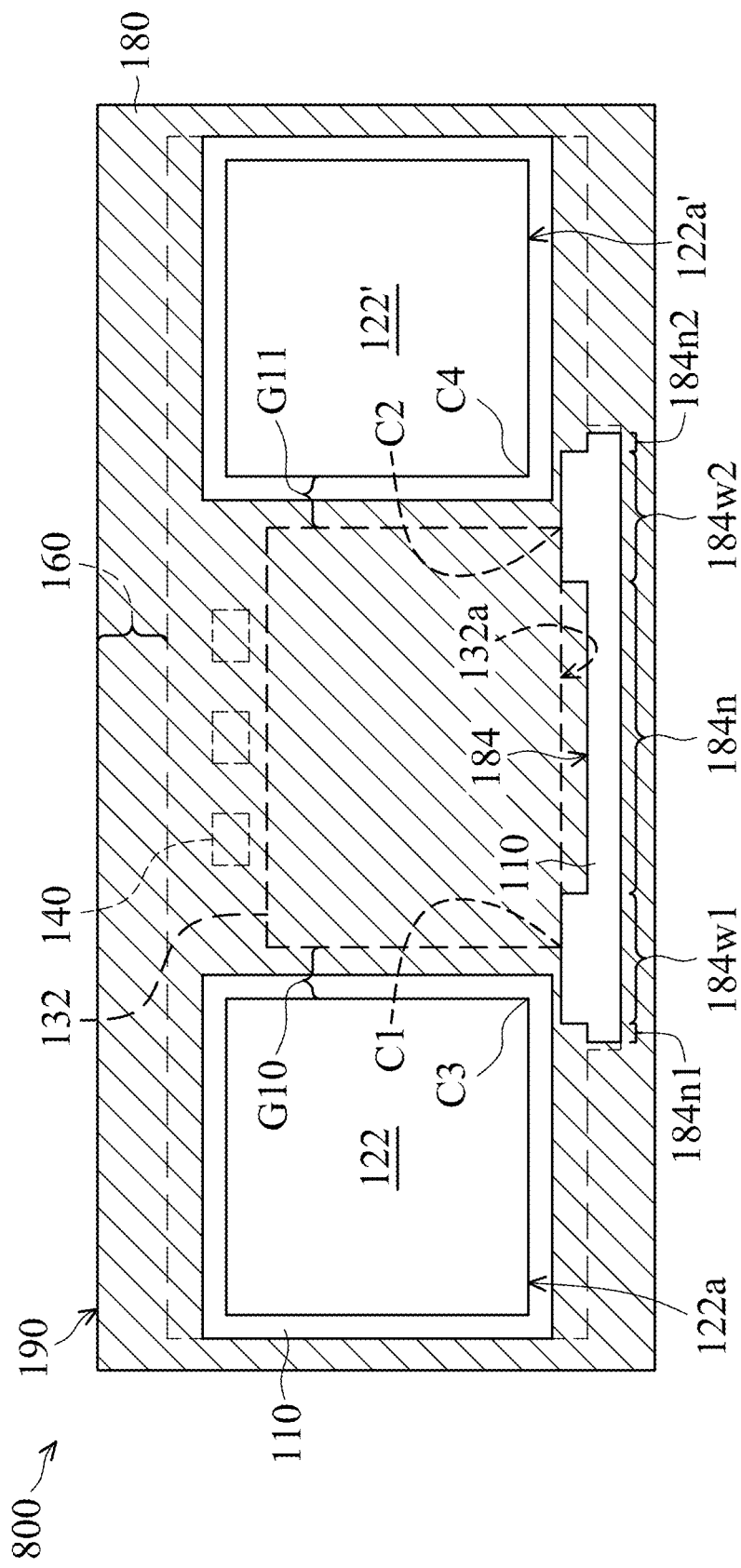
FIG. 8 is a top view of a chip package structure, in accordance with some embodiments.

FIG. 8 is a top view of a chip package structure 800, in accordance with some embodiments. As shown in FIG. 8, the chip package structure 800 is similar to the chip package structure 600 of FIG. 6, except that the opening 184 of the top plate 180 of the chip package structure 800 further has narrow portions 184n1 and 184n2, in accordance with some embodiments. The wide portion 184w1 is connected between the narrow portions 184n and 184n1, in accordance with some embodiments. The wide portion 184w2 is connected between the narrow portions 184n and 184n2, in accordance with some embodiments.

Figure 9:
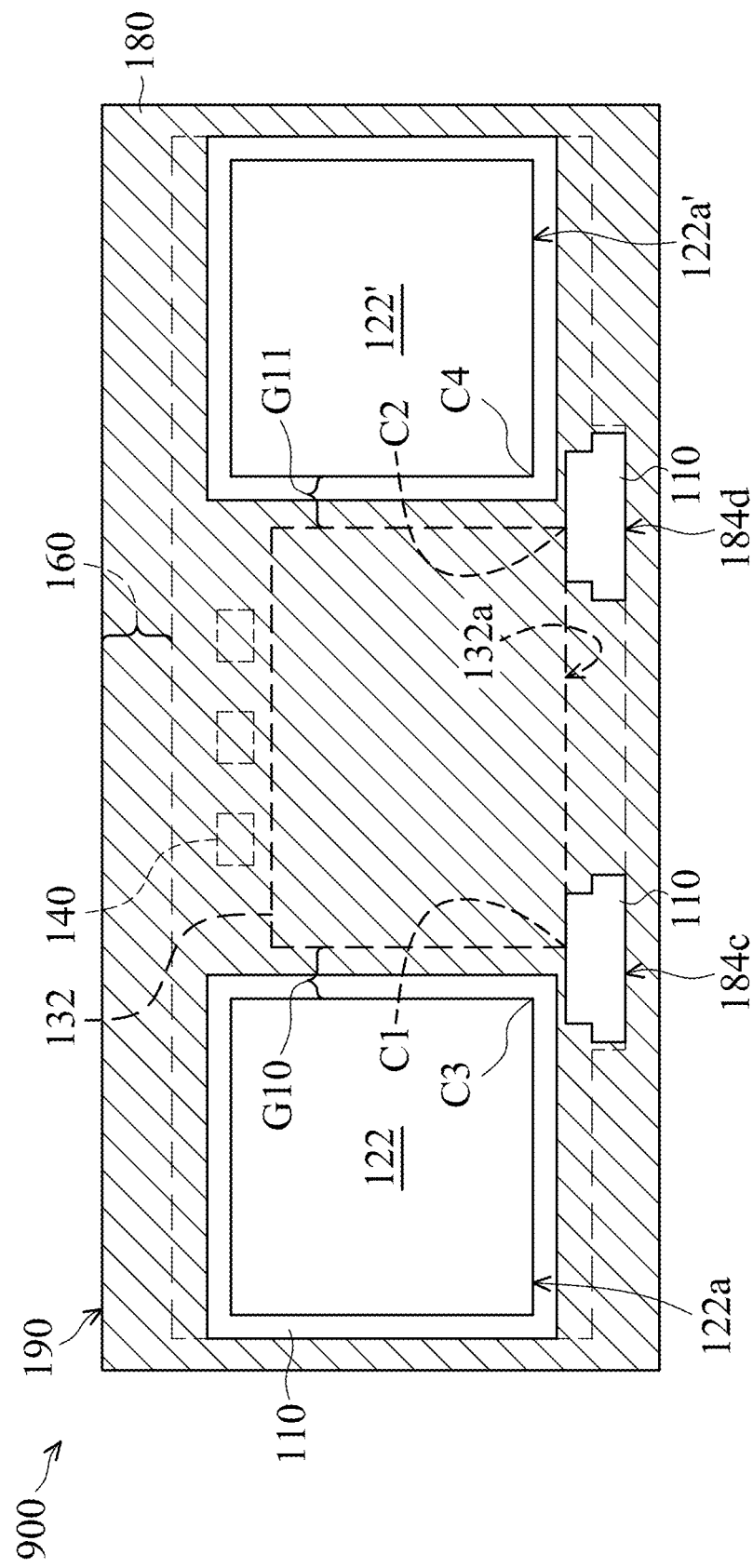
FIG. 9 is a top view of a chip package structure, in accordance with some embodiments.

FIG. 9 is a top view of a chip package structure 900, in accordance with some embodiments. As shown in FIG. 9, the chip package structure 900 is similar to the chip package structure 400 of FIG. 4, except that the openings 184c and 184d of the top plate 180 of the chip package structure 900 has a T-shape (e.g., an inverted T-shape).

Figure 10A:
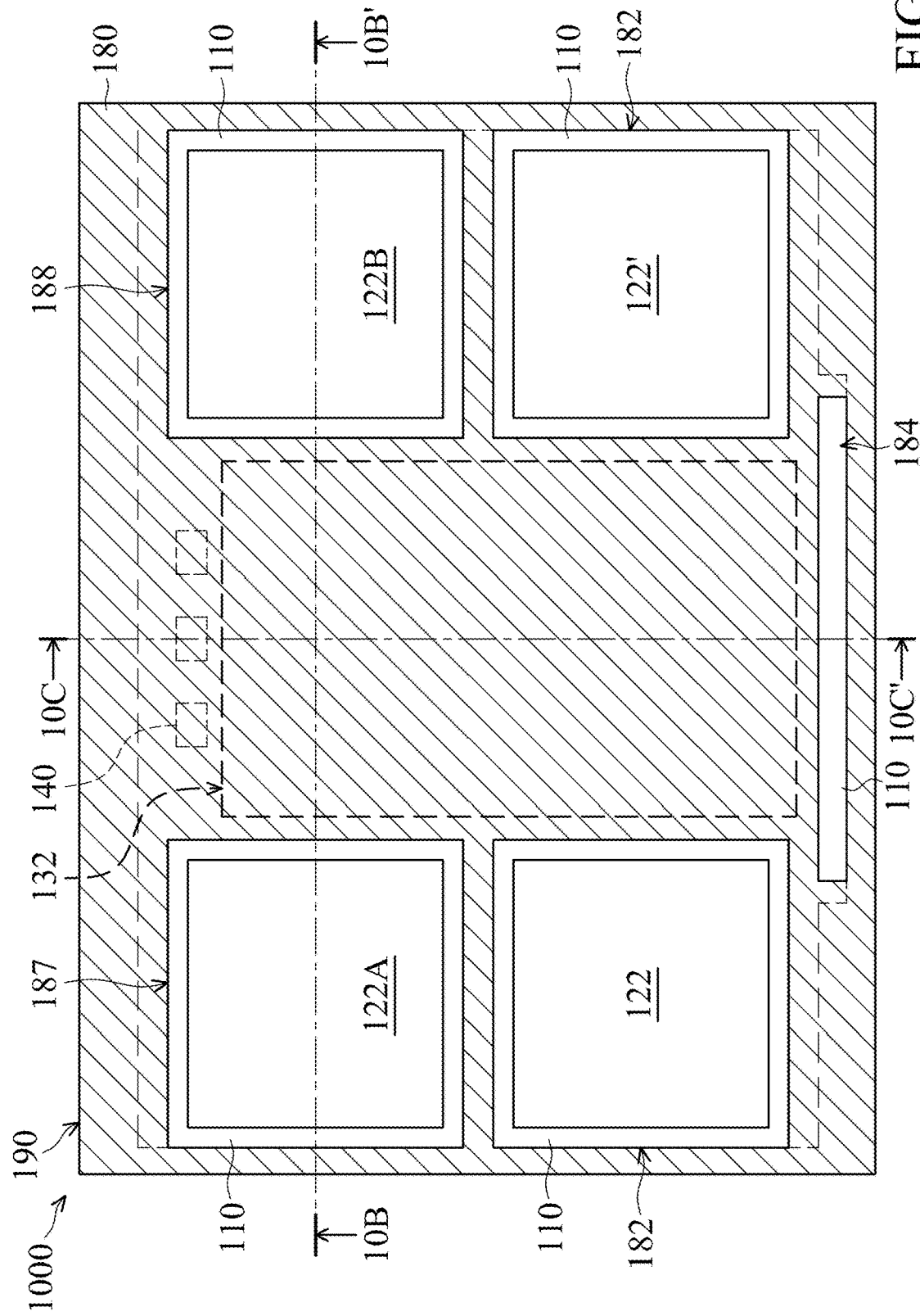
FIG. 10A is a top view of a chip package structure, in accordance with some embodiments.
Figure 10B:
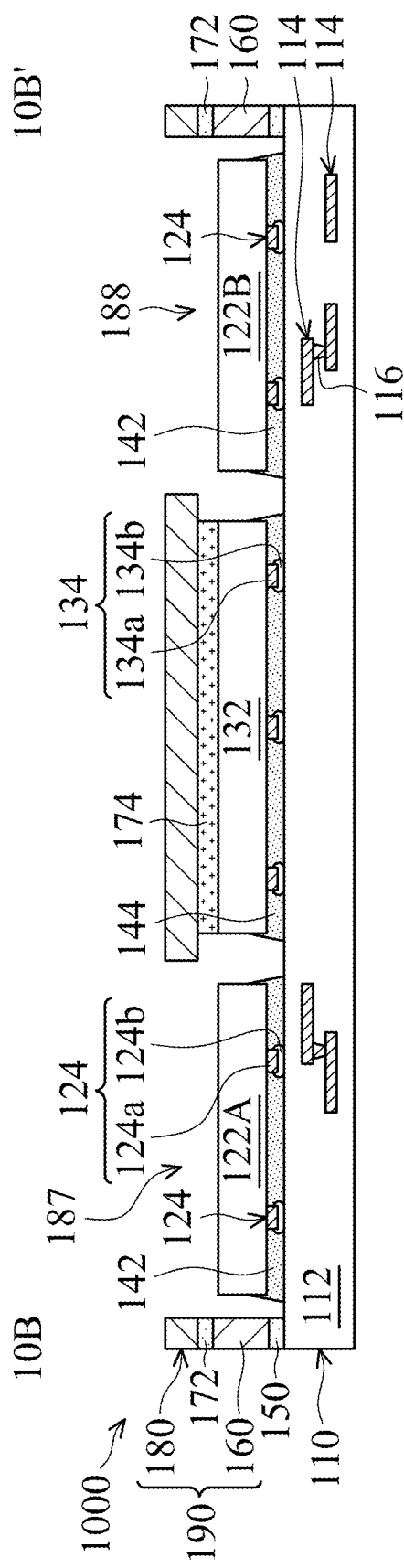
FIG. 10B is a cross-sectional view illustrating the chip package structure along a sectional line 10B-10B' in FIG. 10A, in accordance with some embodiments.
Figure 10C:
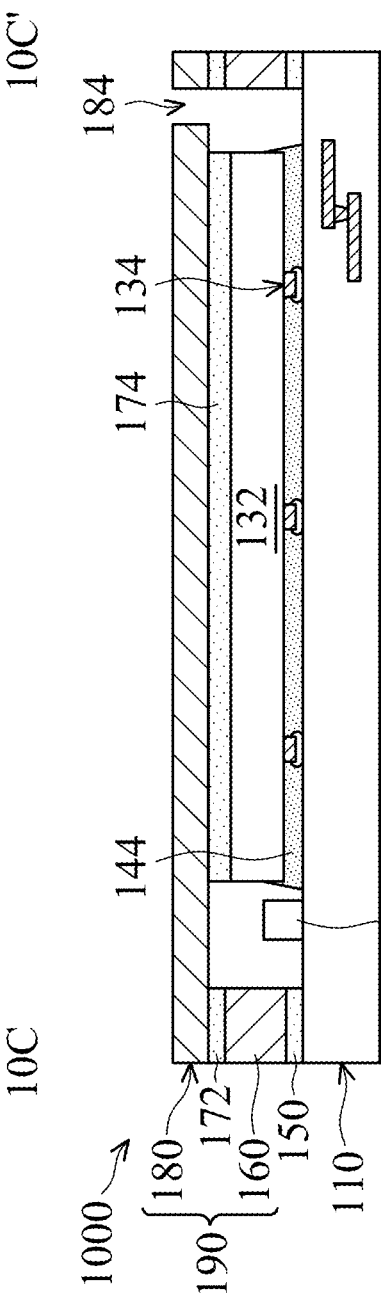
FIG. 10C is a cross-sectional view illustrating the chip package structure along a sectional line 10C-10C' in FIG. 10A, in accordance with some embodiments.

FIG. 10A is a top view of a chip package structure 1000, in accordance with some embodiments. FIG. 10B is a cross-sectional view illustrating the chip package structure 1000 along a sectional line 10B-10B' in FIG. 10A, in accordance with some embodiments. FIG. 10C is a cross-sectional view illustrating the chip package structure 1000 along a sectional line 10C-10C' in FIG. 10A, in accordance with some embodiments.

As shown in FIGS. 10A, 10B, and 10C, the chip package structure 1000 is similar to the chip package structure 100 of FIGS. 1D and 1D-1, except that the chip package structure 1000 further includes chip structures 122A and 122B, in accordance with some embodiments. The chip structure 132 is between the chip structures 122A and 122B, in accordance with some embodiments.

The chip structures 122A and 122B are bonded to the wiring substrate 110 through conductive connectors 124, in accordance with some embodiments. In some embodiments, an underfill layer 142 is formed between the wiring substrate 110 and the chip structures 122A and 122B.

The structures and the materials of the chip structures 122A and 122B, the conductive connectors 124, and the underfill layer 142 are the same as or similar to that of the chip structures 122 and 122', the conductive connectors 124, and the underfill layer 142 of the chip package structure 100 of FIGS. 1D and 1D-1, in accordance with some embodiments.

Figure 11A:
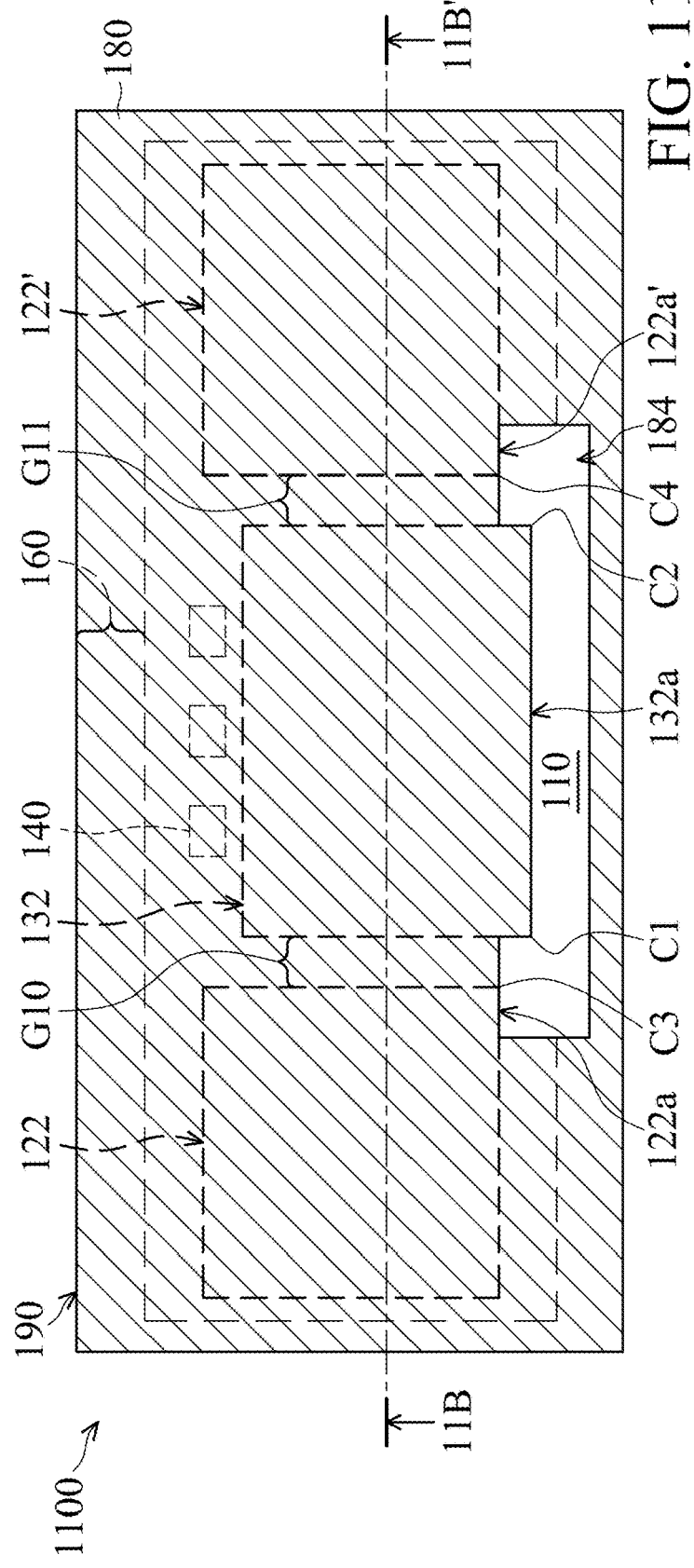
FIG. 11A is a top view of a chip package structure, in accordance with some embodiments.
Figure 11B:
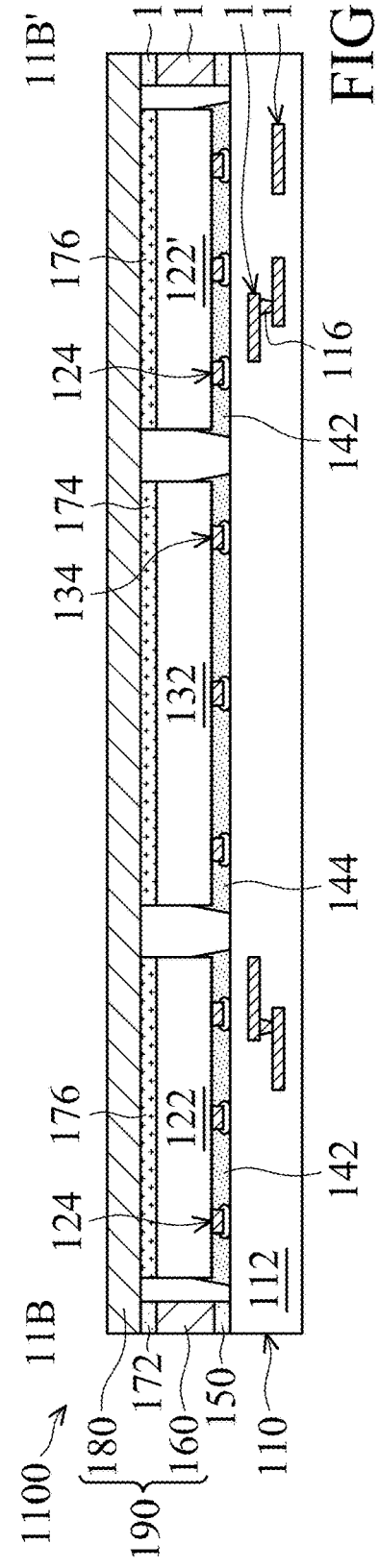
FIG. 11B is a cross-sectional view illustrating the chip package structure along a sectional line 11B-11B' in FIG. 11A, in accordance with some embodiments.

FIG. 11A is a top view of a chip package structure 1100, in accordance with some embodiments. FIG. 11B is a cross-sectional view illustrating the chip package structure 1100 along a sectional line 11B-11B' in FIG. 11A, in accordance with some embodiments.

As shown in FIGS. 11A and 11B, the chip package structure 1100 is similar to the chip package structure 600 of FIG. 6, except that the top plate 180 of the chip package structure 1100 covers the chip structures 122 and 122', in accordance with some embodiments. That is, the top plate 180 does not have the openings 182 of the top plate 180 of the chip package structure 600 of FIG. 6, in accordance with some embodiments.

The chip package structure 1100 further has adhesive layers 176 respectively between the chip structure 122 and the top plate 180 and between the chip structure 122' and the top plate 180, in accordance with some embodiments. The materials of the adhesive layers 176 are the same as or similar to that of the adhesive layers 174, in accordance with some embodiments. The opening 184 surrounds the corners C1 and C2, in accordance with some embodiments.

Figure 12A:
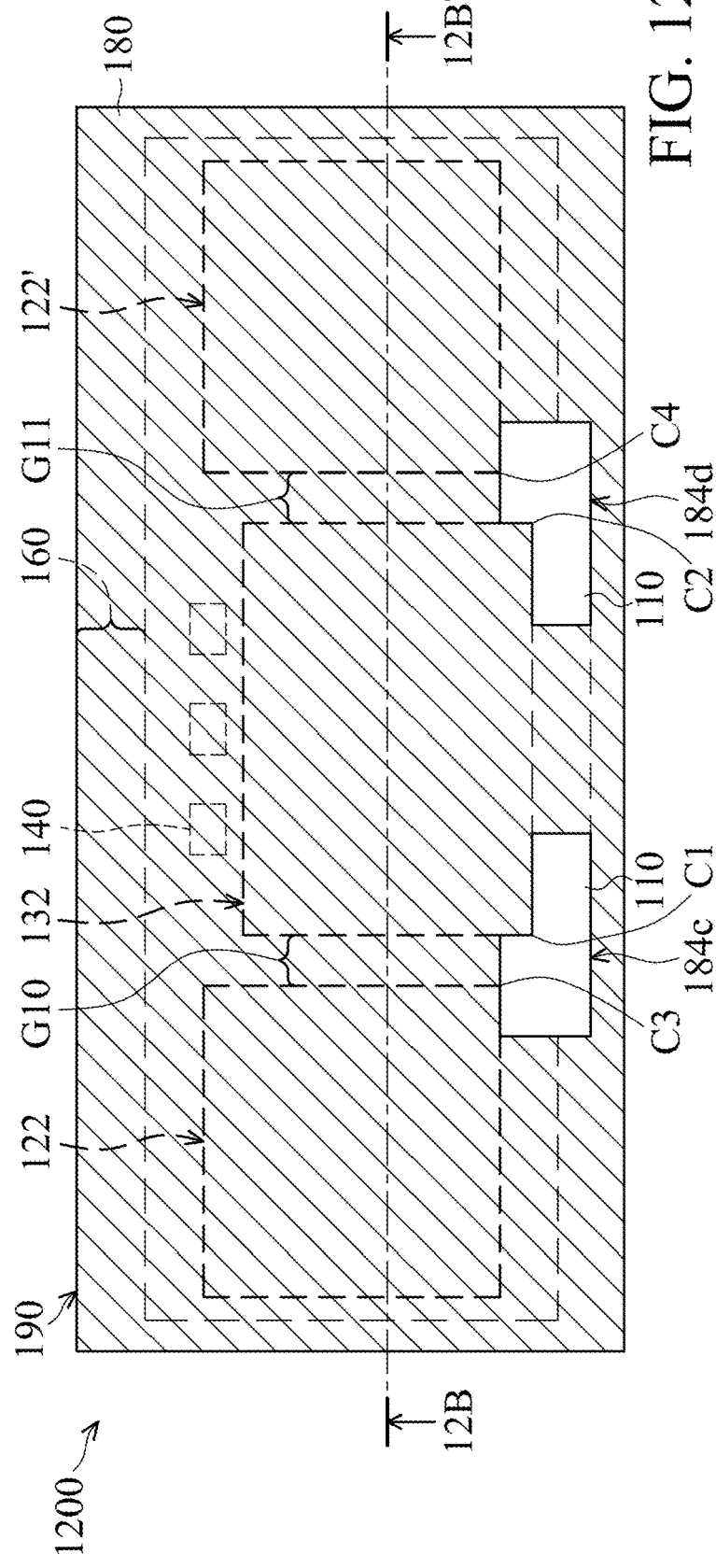
FIG. 12A is a top view of a chip package structure, in accordance with some embodiments.
Figure 12B:
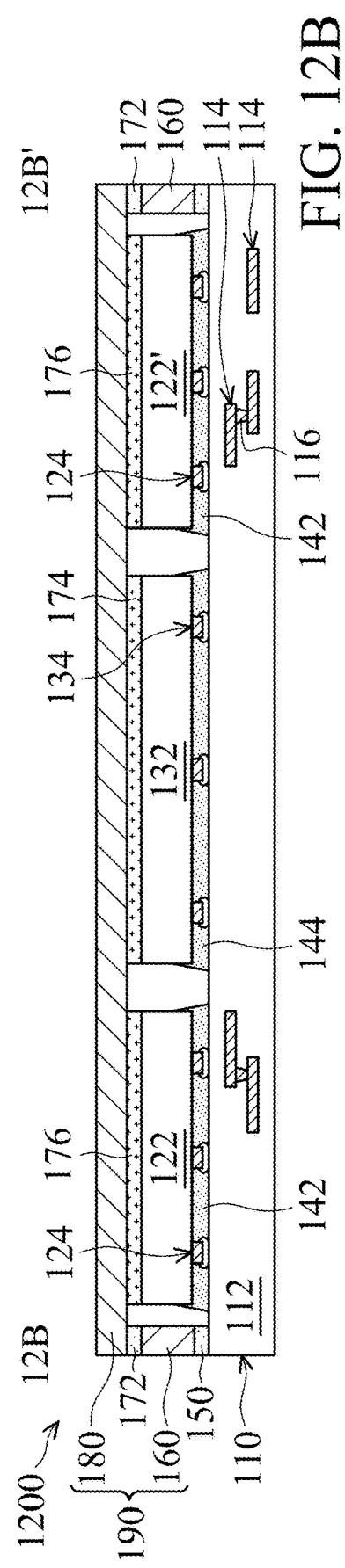
FIG. 12B is a cross-sectional view illustrating the chip package structure along a sectional line 12B-12B' in FIG. 12A, in accordance with some embodiments.

FIG. 12A is a top view of a chip package structure 1200, in accordance with some embodiments. FIG. 12B is a cross-sectional view illustrating the chip package structure 1200 along a sectional line 12B-12B' in FIG. 12A, in accordance with some embodiments.

As shown in FIGS. 12A and 12B, the chip package structure 1200 is similar to the chip package structure 1100 of FIG. 11A, except that the top plate 180 has openings 184c and 184d spaced apart from each other, in accordance with some embodiments. The top plate 180 of the chip package structure 1200 does not have the opening 184 of the top plate 180 of the chip package structure 1100 of FIG. 11, in accordance with some embodiments. The opening 184c surrounds the corner C1 of the chip structure 132, in accordance with some embodiments. The opening 184d surrounds the corner C2 of the chip structure 132, in accordance with some embodiments.

Figure 13A:
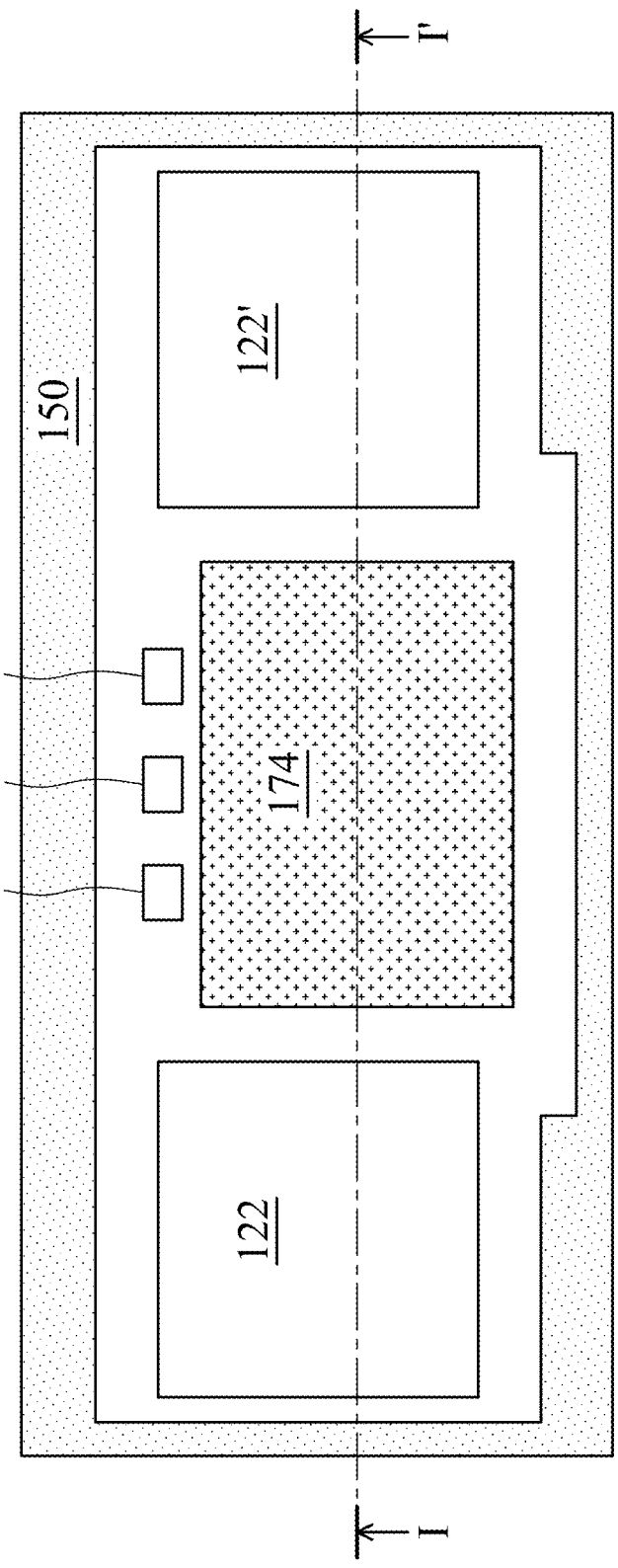
Figures 1, 13A:
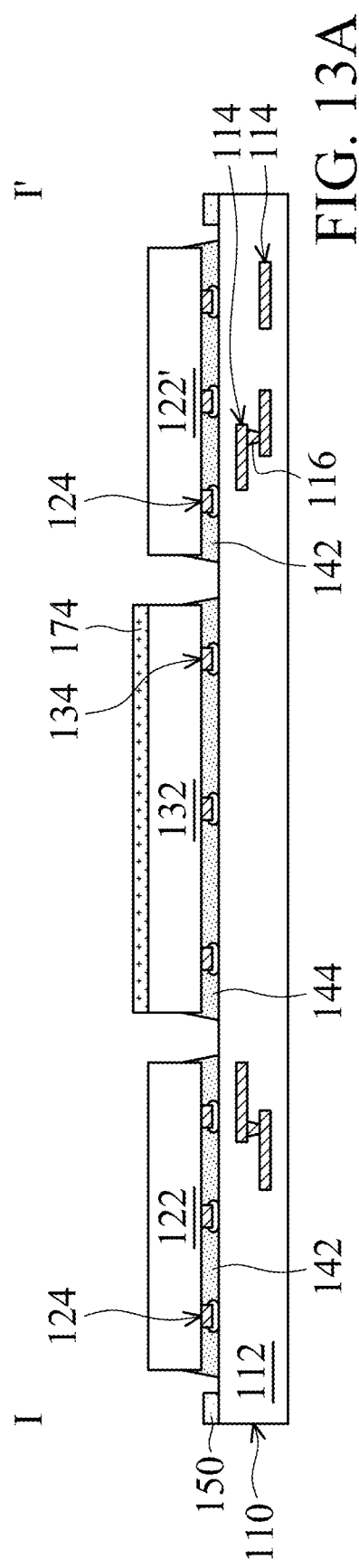
Figures 2, 13B:
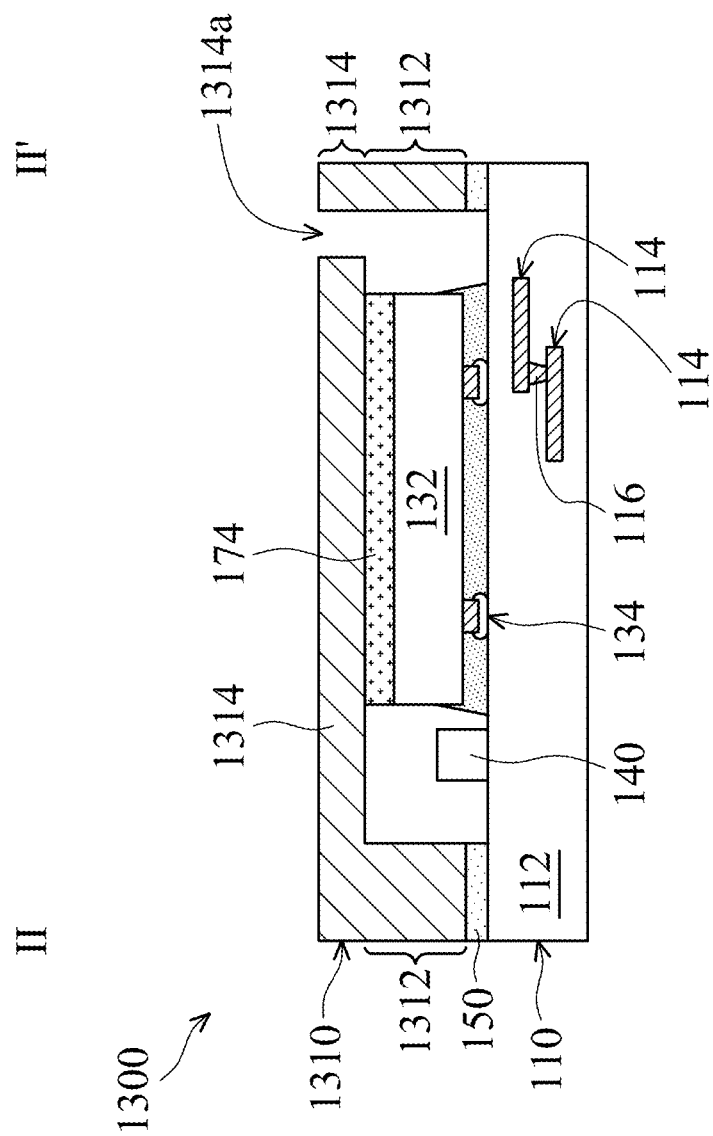

FIGS. 13A-13B are cross-sectional views of various stages of a process for forming a chip package structure, in accordance with some embodiments. FIGS. 13A-1 to 13B-1 are top views of the chip package structure of FIGS. 13A-13B, in accordance with some embodiments. FIG. 13B-2 is a cross-sectional view illustrating the chip package structure along a sectional line II-II' in FIG. 13B-1, in accordance with some embodiments.

After the step of FIG. 1A, as shown in FIGS. 13A and 13A-1, an adhesive layer 174 is formed over the chip structure 132, in accordance with some embodiments. The adhesive layer 174 is made of a combination of polymer and metal (e.g., a silver paste) or a polymer (e.g., epoxy or silicone), in accordance with some embodiments.

Thereafter, as shown in FIGS. 13B, 13B-1, and 13B-2, a heat-spreading lid 1310 is bonded to the adhesive layers 150 and 174, in accordance with some embodiments. In this step, a chip package structure 1300 is substantially formed, in accordance with some embodiments. The heat-spreading lid 1310 covers the chip structure 132 and the devices 140, in accordance with some embodiments. The heat-spreading lid 1310 is formed in one piece, in accordance with some embodiments.

The heat-spreading lid 1310 has a ring structure 1312 and a top plate 1314, in accordance with some embodiments. The top plate 1314 is over the ring structure 1312, the chip structure 132, the adhesive layers 150 and 174, and the devices 140, in accordance with some embodiments. The top plate 1314 has openings 1314a and 1314b, in accordance with some embodiments. The opening 1314a is between the chip structure 132 and the ring structure 1312, in accordance with some embodiments. The openings 1314b respectively expose the chip structures 122 and 122', in accordance with some embodiments.

The heat-spreading lid 1310 is made of a rigid material, such as metal (e.g., copper or iron), alloys thereof (e.g., stainless steel), or another suitable material which is more rigid than the wiring substrate 110, in accordance with some embodiments.

Processes and materials for forming the chip package structures 200, 300, 400, 500, 600, 700, 800, 900, 1000, 1100, 1200, and 1300 may be similar to, or the same as, those for forming the chip package structure 100 described above.

In accordance with some embodiments, chip package structures and methods for forming the same are provided. The methods (for forming the chip package structure) form an opening in a top plate of a heat-spreading lid. The heat-spreading lid covers a chip structure. The chip structure has a first sidewall closer to a ring structure of the heat-spreading lid than other sidewalls of the chip structure, and the opening is between the first sidewall and the ring structure. The opening is able to hinder the transmission of the thermal stress from the first sidewall to the ring structure through the top plate. Therefore, the opening is able to reduce the thermal stress in the ring structure close to the first sidewall, and therefore the opening is able to prevent an adhesive layer over (or under) the ring structure close to the first sidewall from damage in subsequent thermal processes.

In accordance with some embodiments, a chip package structure is provided. The chip package structure includes a wiring substrate. The chip package structure includes a first chip structure over the wiring substrate. The chip package structure includes a heat-spreading lid over the wiring substrate and covering the first chip structure. The heat-spreading lid includes a ring structure and a top plate. The ring structure surrounds the first chip structure. The top plate covers the ring structure and the first chip structure. The first chip structure has a first sidewall and a second sidewall opposite to the first sidewall, a first distance between the first sidewall and the ring structure is less than a second distance between the second sidewall and the ring structure, the top plate has a first opening, the first opening has a first inner wall and a second inner wall facing each other, and the first inner wall and the second inner wall are between the first sidewall and the ring structure in a top view of the heat-spreading lid and the first chip structure.

In accordance with some embodiments, a chip package structure is provided. The chip package structure includes a wiring substrate. The chip package structure includes a first chip structure and a second chip structure over the wiring substrate and spaced apart from each other by a gap. The chip package structure includes a heat-spreading lid over the wiring substrate and covering the first chip structure. The heat-spreading lid includes a ring structure and a top plate, the ring structure surrounds the first chip structure and the second chip structure, the top plate covers the ring structure and the first chip structure, the ring structure has a first portion and a second portion, the first chip structure and the second chip structure are between the first portion and the second portion, the first portion is closer to the first chip structure than the second portion, and the top plate has a first opening between the gap and the first portion.

In accordance with some embodiments, a method for forming a chip package structure is provided. The method includes disposing a first chip structure over a wiring substrate. The method includes forming a heat-spreading lid over the wiring substrate. The heat-spreading lid covers the first chip structure, the heat-spreading lid comprises a ring structure and a top plate, the ring structure surrounds the first chip structure, the top plate covers the ring structure and the first chip structure, the first chip structure has a first sidewall and a second sidewall opposite to each other, the first sidewall is closer to the ring structure than the second sidewall, the top plate has a first opening between the first sidewall and the ring structure, the first opening has a first inner wall and a second inner wall facing each other, and the second inner wall is between the first inner wall and the first sidewall in a top view of the heat-spreading lid and the first chip structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
   a wiring substrate;
   a first chip structure over the wiring substrate; and
   a heat-spreading lid over the wiring substrate and covering the first chip structure, wherein the heat-spreading lid comprises a ring structure and a top plate, the ring structure surrounds the first chip structure, the top plate covers the ring structure and the first chip structure,
   the first chip structure has a first sidewall and a second sidewall opposite to the first sidewall, the first sidewall is closer to the ring structure than the second sidewall, the top plate has a first opening, the first opening is between the first sidewall and the ring structure in a top view of the heat-spreading lid and the first chip structure, the ring structure has a second opening, the first chip structure is in the second opening, the second opening has a first inner wall facing the first chip structure, the first inner wall has a recess, the first opening overlaps the recess in the top view, and the recess of the first inner wall of the second opening of the ring structure is closer to the wiring substrate than the first opening of the top plate.

2. The chip package structure as claimed in claim 1, wherein the first chip structure has a third sidewall connected between the first sidewall and the second sidewall, the first chip structure has a first corner between the first sidewall and the third sidewall, and the first opening is between the first corner and the ring structure.

3. The chip package structure as claimed in claim 2, wherein the first chip structure has a fourth sidewall opposite to the third sidewall, the first chip structure has a second corner between the first sidewall and the fourth sidewall, and the first opening is further between the second corner and the ring structure.

4. The chip package structure as claimed in claim 2, wherein the first chip structure has a fourth sidewall adjacent to the first sidewall and the second sidewall, the first chip structure has a second corner between the first sidewall and the fourth sidewall, the top plate further has a second opening between the second corner and the ring structure, and the second opening is spaced apart from the first opening.

5. The chip package structure as claimed in claim 1, further comprising:
   an adhesive layer between the ring structure and the top plate.

6. The chip package structure as claimed in claim 1, wherein the first chip structure has a first corner adjacent to the first sidewall, the first opening has a first wide portion and a narrow portion, the first wide portion is wider than the narrow portion, and the first wide portion is between the first corner and the ring structure.

7. The chip package structure as claimed in claim 6, wherein the first chip structure further has a second corner adjacent to the first sidewall, the first opening further has a second wide portion, the second wide portion is wider than the narrow portion, and the second wide portion is closer to the second corner than the narrow portion.

8. The chip package structure as claimed in claim 1, wherein the recess of the first inner wall of the second opening of the ring structure is wider than the first opening of the top plate.

9. A chip package structure, comprising:
a wiring substrate;
a first chip structure and a second chip structure over the wiring substrate and spaced apart from each other by a gap; and
a heat-spreading lid over the wiring substrate and covering the first chip structure, wherein the heat-spreading lid comprises a ring structure and a top plate, the ring structure surrounds the first chip structure and the second chip structure, the top plate covers the ring structure and the first chip structure, the ring structure has a first portion, a second portion, and a third portion, the first chip structure is between the first portion and the second portion, the first portion is closer to the first chip structure than the second portion, the second chip structure is between the third portion and the second portion, a first line width of the first portion is less than a second line width of the third portion, the first portion and the third portion are made of a same material, and the top plate has a first opening between the gap and the first portion.

10. The chip package structure as claimed in claim 9, wherein the gap extends toward the first opening in a top view of the heat-spreading lid, the first chip structure, and the second chip structure.

11. The chip package structure as claimed in claim 9, wherein the first chip structure has a corner adjacent to the gap, and the first opening surrounds the corner.

12. The chip package structure as claimed in claim 9, wherein the first line width of the first portion is less than a third line width of the second portion.

13. The chip package structure as claimed in claim 12, wherein the ring structure further has a fourth portion, the first portion is connected between the third portion and the fourth portion, and the first line width of the first portion is less than a fourth line width of the fourth portion.

14. The chip package structure as claimed in claim 13, further comprising:
a third chip structure over the wiring substrate and between the fourth portion and the second portion of the ring structure.

15. A chip package structure, comprising:
a wiring substrate;
a first chip structure over the wiring substrate; and
a heat-spreading lid over the wiring substrate, wherein the heat-spreading lid covers the first chip structure, the heat-spreading lid comprises a ring structure and a top plate, the ring structure surrounds the first chip structure, the top plate covers the ring structure and the first chip structure,
the first chip structure has a first sidewall, a second sidewall, and a third sidewall connected between the first sidewall and the second sidewall, the third sidewall faces a first portion of the ring structure, the first sidewall is closer to the ring structure than the second sidewall, a first distance between the third sidewall and the first portion of the ring structure is greater than a second distance between the first sidewall and the ring structure and greater than a third distance between the second sidewall and the ring structure, the first chip structure has a first corner between the first sidewall and the third sidewall, the top plate has a first opening between the first corner and the ring structure in a top view of the heat-spreading lid and the first chip structure.

16. The chip package structure as claimed in claim 9, wherein the second portion of the ring structure is made of the material.

17. The chip package structure as claimed in claim 15, wherein the first chip structure has a fourth sidewall opposite to the third sidewall, the first chip structure has a second corner between the first sidewall and the fourth sidewall, and the first opening is further between the second corner and the ring structure.

18. The chip package structure as claimed in claim 15, wherein the first chip structure has a fourth sidewall adjacent to the first sidewall and the second sidewall, the first chip structure has a second corner between the first sidewall and the fourth sidewall, the top plate further has a second opening between the second corner and the ring structure, and the second opening is spaced apart from the first opening.

19. The chip package structure as claimed in claim 15, wherein the first opening has a U-shape.

20. The chip package structure as claimed in claim 18, wherein the fourth sidewall faces a second portion of the ring structure, a fourth distance between the fourth sidewall and the second portion of the ring structure is greater than the second distance between the first sidewall and the ring structure and greater than the third distance between the second sidewall and the ring structure.

* * * * *